(12) United States Patent
Shibasaki et al.

(10) Patent No.: US 11,398,577 B2
(45) Date of Patent: Jul. 26, 2022

(54) MULTI-JUNCTION SOLAR CELL

(71) Applicant: Kabushiki Kaisha Toshiba, Minato-ku (JP)

(72) Inventors: Soichiro Shibasaki, Nerima (JP);
Kazushige Yamamoto, Yokohama (JP);
Hiroki Hiraga, Kawasaki (JP);
Naoyuki Nakagawa, Setagaya (JP);
Mutsuki Yamazaki, Yokohama (JP);
Shinya Sakurada, Shinagawa (JP);
Michihiko Inaba, Yokohama (JP);
Hitomi Saito, Kawaguchi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 403 days.

(21) Appl. No.: 15/878,000

(22) Filed: Jan. 23, 2018

(65) Prior Publication Data
US 2018/0151771 A1 May 31, 2018

Related U.S. Application Data

(62) Division of application No. 14/478,252, filed on Sep. 5, 2014, now abandoned.

(30) Foreign Application Priority Data

Sep. 24, 2013 (JP) .................. 2013-197610

(51) Int. Cl.
*H01L 31/0725* (2012.01)
*H01L 31/068* (2012.01)
*H01L 31/043* (2014.01)

(52) U.S. Cl.
CPC ........ *H01L 31/0725* (2013.01); *H01L 31/043* (2014.12); *H01L 31/0682* (2013.01); *Y02E 10/547* (2013.01)

(58) Field of Classification Search
CPC . H01L 31/0323; H01L 31/043; H01L 31/044; H01L 31/0443; H01L 31/0725;
(Continued)

(56) References Cited

U.S. PATENT DOCUMENTS 4,110,122 A * 8/1978 Kaplow ................ H01L 31/068
136/246
4,200,472 A * 4/1980 Chappell ............... H01L 31/052
136/246
(Continued)

FOREIGN PATENT DOCUMENTS

CN 101366125 A 2/2009
CN 101924156 A 12/2010
(Continued)

OTHER PUBLICATIONS

Combined Office Action and Search Report dated Jan. 27, 2016 in Taiwanese Patent Application No. 10328641 (with English translation).
(Continued)

*Primary Examiner* — Eric R Smith
(74) *Attorney, Agent, or Firm* — Oblon, McClelland, Maier & Neustadt, L.L.P.

(57) ABSTRACT

A multi-junction solar cell of an embodiment includes a first solar cell including a first photoelectric conversion device, a second solar cell including a plurality of second photoelectric conversion devices connected in series and having a back contact, and an insulating layer between the first solar cell and the second solar cell. A device isolation region is provided between the second photoelectric conversion devices connected in series.

17 Claims, 14 Drawing Sheets

(58) Field of Classification Search
CPC ............. H01L 31/0682; H01L 31/0687; H01L 31/06875; H01L 31/022441–022458; H01L 31/047; H01L 31/02245; H01L 31/0516; H01L 31/0475
See application file for complete search history.

(56) References Cited

U.S. PATENT DOCUMENTS

| | | | |
|---|---|---|---|
| 4,295,002 A * | 10/1981 | Chappell | H01L 31/035281 |
| | | | 136/244 |
| 4,461,922 A | 7/1984 | Gay | |
| 4,477,721 A * | 10/1984 | Chappell | H01L 31/173 |
| | | | 250/551 |
| 4,733,369 A * | 3/1988 | Bogner | G02F 1/17 |
| | | | 359/240 |
| 5,164,019 A * | 11/1992 | Sinton | H01L 31/0475 |
| | | | 136/249 |
| 6,166,320 A * | 12/2000 | Nagashima | B82Y 20/00 |
| | | | 136/249 |
| 7,863,515 B2 | 1/2011 | Ahn et al. | |
| 8,530,263 B2 | 9/2013 | Lee et al. | |
| 8,796,063 B2 | 8/2014 | Lee et al. | |
| 2003/0160251 A1 | 8/2003 | Wanlass et al. | |
| 2005/0150542 A1 | 7/2005 | Madan | |
| 2008/0230112 A1 | 9/2008 | Barnham et al. | |
| 2008/0264478 A1 | 10/2008 | Ahn et al. | |
| 2010/0059111 A1 | 3/2010 | Shin et al. | |
| 2010/0078056 A1 | 4/2010 | Hovel | |
| 2010/0170556 A1 | 7/2010 | Frolov | |
| 2010/0200043 A1 | 8/2010 | Lombardo | |
| 2010/0263713 A1 * | 10/2010 | Ludowise | H01L 31/022425 |
| | | | 136/249 |
| 2010/0307557 A1 * | 12/2010 | Yamazaki | B60T 1/10 |
| | | | 136/244 |
| 2010/0307559 A1 * | 12/2010 | Yamazaki | H01L 31/046 |
| | | | 136/244 |
| 2011/0088744 A1 | 4/2011 | Xia et al. | |
| 2011/0155230 A1 | 6/2011 | Tsai | |
| 2011/0186112 A1 | 8/2011 | Aernouts et al. | |
| 2011/0192452 A1 | 8/2011 | Yamazaki et al. | |
| 2011/0315190 A1 | 12/2011 | Yoshikawa et al. | |
| 2012/0000518 A1 | 1/2012 | Tokioka et al. | |
| 2012/0097224 A1 | 4/2012 | Guo | |
| 2012/0204939 A1 | 8/2012 | Lee | |
| 2012/0247544 A1 | 10/2012 | Choi et al. | |
| 2012/0298175 A1 * | 11/2012 | Van Roosmalen | H01L 31/0475 |
| | | | 136/244 |
| 2013/0037100 A1 * | 2/2013 | Platzer | H01L 31/022466 |
| | | | 136/256 |
| 2013/0112244 A1 * | 5/2013 | Wanlass | H01L 31/06875 |
| | | | 136/249 |
| 2014/0305504 A1 * | 10/2014 | Masuda | H01L 31/1804 |
| | | | 136/261 |

FOREIGN PATENT DOCUMENTS

| | | |
|---|---|---|
| CN | 102956650 A | 3/2013 |
| EP | 1 962 331 A2 | 8/2008 |
| EP | 1 962 331 A3 | 8/2008 |
| JP | 61-75567 | 4/1986 |
| JP | 2001-264520 A | 9/2001 |
| JP | 2006-344724 A | 12/2006 |
| JP | 2008-211217 A | 9/2008 |
| JP | 2009-510719 A | 3/2009 |
| JP | 2010-87504 | 4/2010 |
| JP | 2011-526737 | 10/2011 |
| JP | 2012-138556 | 7/2012 |
| JP | 2012-151471 A | 8/2012 |
| JP | 2012-195416 | 10/2012 |
| TW | 200703496 A | 1/2007 |
| TW | I366493 B | 6/2012 |
| WO | WO 2010/087312 A1 | 8/2010 |
| WO | 2010/101030 A1 | 9/2010 |
| WO | WO 2014092677 A1 | 6/2014 |
| WO | WO-2014092677 A1 * | 6/2014 ......... H01L 31/0725 |

OTHER PUBLICATIONS

Combined Office Action and Search Report dated Feb. 19, 2016 in Chinese Patent Application No. 201410440200.9 (with English translation).

Extended European Search Report dated May 6, 2015 in Patent Application No. 14182810.3.

* cited by examiner

US 11,398,577 B2

MULTI-JUNCTION SOLAR CELL

CROSS-REFERENCE TO RELATED APPLICATION

This application is a divisional application of U.S. application Ser. No. 14/478,252, filed Sep. 5, 2014, which is based upon and claims the benefit of priority from Japanese Patent Application No. 2013-197610, filed on Sep. 24, 2013; the entire contents of which are incorporated herein by reference.

FIELD

Embodiments described herein relate to a multi-junction solar cell.

BACKGROUND

High-efficiency solar cells include multi-junction (tandem type) solar cells. While the multi-junction solar cells are expected to be higher in efficiency than single-junction solar cells, the difference in the number of photons absorbed by each layer will produce a difference in current value to limit the conversion efficiency to that of the layer with the lowest value. This limit is unavoidable as long as a series junction is adopted. On the other hand, this limit can be avoided by extracting a terminal from each layer, while more than one power converter or the like will be required.

DETAILED DESCRIPTION

A multi-junction solar cell of an embodiment includes a first solar cell including a first photoelectric conversion device, a second solar cell including a plurality of second photoelectric conversion devices connected in series and having a back contact, and an insulating layer between the first solar cell and the second solar cell. A device isolation region is provided between the second photoelectric conversion devices connected in series.

Figure 1:
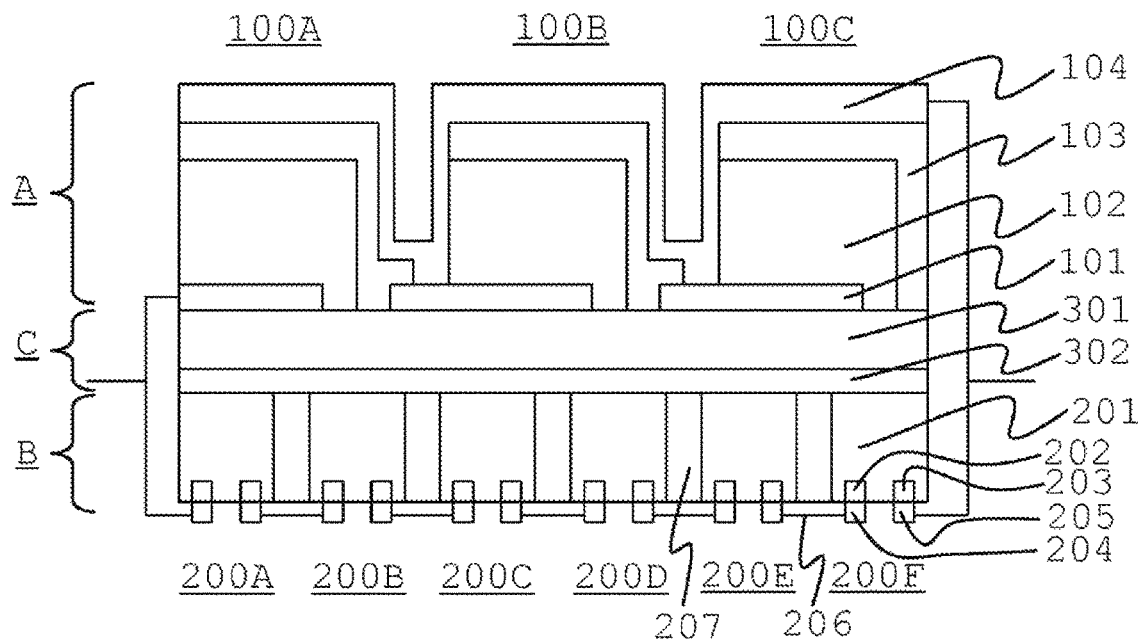
FIG. 1 is a conceptual diagram of a multi-junction solar cell according to an embodiment.

Embodiments will be described in detail below with reference to the drawings. A multi-junction solar cell according to an embodiment has, as shown in FIG. 1, a first solar cell A, an insulating layer C, and a second solar cell B. The insulating layer C is situated between the first solar cell A and the second solar cell B. In an embodiment, a two-junction solar cell is adopted, but a three or more-junction solar cell may be adopted. The first solar cell A and the second solar cell B are connected in parallel.

The first solar cell includes one or more first photoelectric conversion devices 100. The first solar cell A serves as a top cell of a multi-junction solar cell. In FIG. 1, the multiple photoelectric conversion devices of the first solar cell A are denoted by 100A, 100B, and 100C. While FIG. 1 has the form of the three photoelectric conversion devices 100A to 100C connected in series, the number of elements depends on the design. The photoelectric conversion devices 100A to 100C of the first solar cell A have lower electrodes 101 on the insulating layer C, photoelectric conversion layers 102 on the lower electrodes 101, upper electrodes 103 on the photoelectric conversion layers 102, and an anti-reflection film 104 on the upper electrodes 103.

(Lower Electrode)

In an embodiment, the lower electrodes 101, which are electrodes of the photoelectric conversion devices 100A to 100C, are conductive films formed on the insulating layer C. A conductive film integrally formed on the insulating layer C is divided by, for example, scribing into the lower electrodes 101 depending on the number of photoelectric conversion devices. Conductive and transparent films can be used as the lower electrodes 101. Among the films, an ITO (Indium Tin Oxide ((In,Sn)O$_\alpha$, 1≤α≤3): Indium Tin Oxide) film as a transparent conductive film is desirably used for the lower electrodes 101. The lower electrodes 101 typically have a thickness of 100 nm to 1000 nm. The lower electrode 101 is connected to the adjacent upper electrode 103. The upper electrode 103 of the photoelectric conversion device 100A is connected to the lower electrode 101 of the photoelectric conversion device 100B, and the upper electrode 103 of the photoelectric conversion device B is connected to the lower electrode 101 of the photoelectric conversion device 100C. These connections between the lower electrodes 101 and the upper electrode 103 connect the three photoelectric conversion devices 100 in series. When the devices are not connected in series, these connections are not adopted. In the case of connections in parallel, the desired lower electrodes 101 may be connected to each other, whereas the desired upper electrodes 103 may be connected to each other.

(Photoelectric Conversion Layer)

The photoelectric conversion layers 102 according to an embodiment is a homojunction compound semiconductor layer of a p-type compound semiconductor layer and an n-type compound semiconductor layer, or a heterojunction compound semiconductor layer of a p-type compound semiconductor layer and an n-type buffer layer. A photoelectric conversion layer integrally formed on the lower electrodes 101 is divided by scribing into the photoelectric conversion layers 102 depending on the number of photoelectric conversion devices. These photoelectric conversion layers 102 convert light into electricity through the compound semiconductor. The p-type compound semiconductor layer refers to a layer in a region of the photoelectric conversion layer 102 on the lower electrode 101. The n-type compound semiconductor layer or n-type buffer layer refers to a layer in a region of the photoelectric conversion layer 102 on the upper electrode 103. Chalcopyrite compounds such as Cu(In,Al,Ga) (Se,S)$_2$ (hereinafter, referred to as "CICS", if necessary) and CuInTe$_2$ (hereinafter, referred to as "CIT", if necessary) containing, for example, composed of a Group I element, Group III element, and a Group VI element can be used as the compound semiconductor for the photoelectric conversion layers 102. Besides chalcopyrite compounds, stannite compounds and kesterite compounds can be also used as the compound semiconductor for the photoelectric conversion layers 102. In addition, besides these compounds, compound semiconductor layers which have wider gaps than photoelectric conversions of the second solar cells B can be used for the photoelectric conversion layers 102 of the first photoelectric conversion devices 100. CdS, etc. can be used as the n-type buffer layer. The chemical formulas which represent the compounds for the photoelectric conversion layers 102 include Cu(Al$_w$In$_x$Ga$_{1-w-x}$)(S$_y$Se$_z$Te$_{1-y-z}$)$_2$ and Cu$_2$ZnSn(S$_y$Se$_{1-y}$)$_4$. The w, x, y, and z respectively meet $0 \leq w \leq 1$, $0 \leq x \leq 1$, $0 \leq y \leq 1$, $0 \leq z \leq 1$, $w+x \leq 1$ and $y+z \leq 1$. The composition of the photoelectric conversion layer 102 can be measured by inductively-coupled plasma (ICP: Inductively Coupled Plasma) mass spectrometry.

The photoelectric conversion layers 102 typically have a thickness of 1000 nm to 3000 nm. The p-type compound semiconductor layers herein preferably have a thickness of 1000 nm to 2500 nm. In addition, the n-type compound semiconductor layers or n-type buffer layers preferably have a thickness of 10 nm to 800 nm. The Group I element is preferably Cu. The Group III element is preferably at least one element selected from the group consisting of Al, In, and Ga, and more preferably includes Al. The Group VI element is preferably at least one element selected from the group consisting of O, S, Se, and Te, and more preferably includes Se. Ga is more preferably used as the Group III element because the use of Ga in combination with Al makes it easy to adjust the band gap to the desired level. In addition, S is more preferably used as the Group VI element because of being likely to provide p-type semiconductor. As the photoelectric conversion layers 102, compound semiconductors can be used such as specifically, Cu(Al, Ga)(S, Se)$_2$, Cu(Al, Ga)(Se, Te)$_2$, Cu(Al, Ga, In)Se$_2$, or Cu$_2$ZnSnS$_4$, more specifically, Cu(Al, Ga)Se$_2$, Cu(In,Al)Se$_2$, CuGaSe$_2$, CuInTe$_2$, CuAlSe$_2$, Ag(In, Ga)Se$_2$, Ag(In,Al)Se$_2$, Ag(Ga,Al)Se$_2$, or Ag(In,Ga,Al)(S,Se)$_2$. There is preferably, between the lower electrodes 101 and the photoelectric conversion layers 102, a compound composed of the elements contained in the respective electrodes and layers.

(Upper Electrode)

In an embodiment, the upper electrodes 103 refer to a film that is transparent to light such as sunlight, and electrically conductive. An upper electrode integrally formed on the photoelectric conversion layers 102 is divided by scribing into the upper electrodes 103 depending on the number of photoelectric conversion devices 100. The upper electrodes 103 are connected to the lower electrodes 101 to connect the photoelectric conversion devices 100A to 100C in series. For example, ZnO doped with Al, B, Ga, or the like can be used for the upper electrodes 103. The upper electrodes 103 can be deposited by sputtering, chemical vapor deposition (Chemical Vapor Deposition: CVD), or the like. Further, i-ZnO on the order of, for example, 10 nm to 100 nm in thickness may be formed as a semi-insulating layer between the upper electrodes 103 and deposited by sputtering, chemical vapor deposition (Chemical Vapor Deposition: CVD), or the like. Further, i-ZnO on the order of, for example, 10 nm to 100 nm in thickness may be formed as a semi-insulating layer between the upper electrodes 103 and the photoelectric conversion layers 102. The semi-insulating layer refers to a layer including particles of an oxide containing at least one element of Zn, Ti, In, and Mg. For example, particles of an oxide containing Zn and Mg elements are represented by Zn$_{1-x}$Mg$_x$O ($0<x<1$). The oxide particles preferably have an average primary particle size of 1 nm to 40 nm. In addition, the layer is desirably transparent and small in sunlight absorption loss, because of being located above the photoelectric conversion layers 102. Further, CdS on the order of, for example, 1 nm to 10 nm in thickness may be formed between the semi-insulating layers and the photoelectric conversion layers 102. This serves to fill a deficiency of Group VI element in the photoelectric conversion layers 102, and improves the open circuit voltage. In addition, the CdS has almost no light absorption loss, because of the extremely small film thickness. Further, a window layer may be provided between the upper electrodes 103 and the photoelectric conversion layers 102.

(Window Layer: Not Shown)

The window layer (not shown) according to an embodiment is an i-type high-resistance (semi-insulating) layer provided between the upper electrode 103 and the photoelectric conversion layer 102. The window layer is a layer containing any compound of ZnO, MgO, (Zn$_a$Mg$_{1-a}$)O, InGa$_b$Zn$_d$O$_c$, SnO, InSn$_d$O$_c$, TiO$_2$, ZrO$_2$, or composed of one or more compounds thereof. The a, b, c, and d preferably meet $0<a<1$, $0<b<1$, $0<c<1$, and $0<d<1$, respectively. The provision of the high-resistance layer between the upper electrode 103 and the photoelectric conversion layer 102 has the advantage of reducing the leakage current from the n-type compound semiconductor layer to the upper electrode 103 to improve the conversion efficiency. The window layer is preferably not excessively thick, because the compound constituting the window layer contains a high-resistance compound. Alternatively, when the window layer is excessively thin in film thickness, the effect of reducing the leakage current will be substantially lost. Accordingly, the preferred film thickness of the window layer is 5 nm to 100 nm on average.

Methods for forming the window layer include CVD methods, spin coating methods, dip methods, deposition methods, and sputtering methods. The CVD methods provide an oxide thin film for the window layer in the following way. The oxide thin film is obtained by introducing, into a chamber, a member after the formation of the photoelectric conversion layers 102, heating the member, and further introducing an organometallic compound containing at least any of Zn, Mg, In, Ga, Sn, Ti, and Zr, water, etc. into the chamber to cause a reaction on the n-type compound semiconductor layer. The spin coating methods provide an oxide thin film for the window layer in the following way. A solution containing a organometallic compound or oxide particles containing at least any of Zn, Mg, In, Ga, Sn, Ti, and Zr is applied by spin coating onto a member after the formation of the photoelectric conversion layers 102. After the application, the solution is heated or reacted by a dryer to obtain an oxide thin film. The dipping methods provide an oxide thin film for the window layer in the following way. The n-type compound semiconductor layer side of a member after the formation of the photoelectric conversion layers 102 is dipped in the same solution as in the spin coating methods. After the required time, the member is pulled up from the solution. After pulling up, the solution on the member is heated or reacted to obtain an oxide thin film. The deposition methods provide a compound thin film for the window layer in the following way. In the methods, a window layer material is sublimated by resistance heating, laser irradiation, or the like to obtain an oxide thin film. The sputtering methods refer to methods in which a target is irradiated with plasma to obtain a window layer. Among the CVD methods, spin coating methods, dipping methods, deposition methods, sputtering methods, the spin coating methods and the dipping methods are film formation methods which cause less damage to the photoelectric conversion layers 102, and preferred preparation methods from the perspective of increase in efficiency, in that the methods will not cause the photoelectric conversion layers 102 to produce any recombination center.

(Interlayer: Not Shown)

In an embodiment, the interlayer (not shown) is a compound thin film layer provided between the photoelectric conversion layer 102 and the upper electrode 103, or between the photoelectric conversion layer 102 and the window layer. In an embodiment, photoelectric conversion devices are preferred include the interlayer, but the interlayer may be omitted. The interlayer is a thin film containing any compound of ZnS, $Zn(O_\alpha S_{1-\alpha})$, $(Zn_\beta Mg_{1-\beta})(O_\alpha S_{1-\alpha})$, $(Zn_\beta Cd_\gamma Mg_{1-\beta-\gamma})(O_\alpha S_{1-\alpha})$, CdS, $Cd(O_\alpha S_{1-\alpha})$, $(Cd_\beta Mg_{1-\beta})S$, $(Cd_\beta Mg_{1-\beta})(O_\alpha S_{1-\alpha})$, $In_2S_3$, $In_2(O_\alpha S_{1-\alpha})$, CaS, $Ca(O_\alpha S_{1-\alpha})$, SrS, $Sr(O_\alpha S_{1-\alpha})$, ZnSe, $ZnIn_{2-\delta}Se_{4-\epsilon}$, ZnTe, CdTe, and Si ($\alpha$, $\beta$, $\gamma$, $\delta$, and $\epsilon$ preferably meet $0<\alpha<1$, $0<\beta<1$, $0<\gamma<1$, $0<\delta<2$, $0<\epsilon<4$, and $\beta+\gamma<1$, respectively), or composed of one or more compounds thereof. The interlayer may have the form of covering only some of the surfaces of the n-type compound semiconductor layers on the upper electrodes 103. For example, the interlayer only has to cover 50% of the surfaces of the n-type compound semiconductor layers on the upper electrodes 103. From the perspective of environmental issues, it is preferable to use a compound containing no Cd for the interlayer. The interlayer volume resistivity 1 Ωcm or more has the advantage of making it possible to suppress leakage current derived from low-resistance components which can be present in the p-type compound semiconductor layer. Further, the formation of an interlayer containing S can dope the n-type compound semiconductor layer with the S contained in the interlayer.

With the interlayer, the conversion efficiency can be improved for the photoelectric conversion devices 100A to 100C including the homojunction photoelectric conversion layers 102. With the interlayer, the open circuit voltage can be increased to improve the conversion efficiency for the photoelectric conversion devices 100A to 100C including the photoelectric conversion layers 102 of homojunction structure. The role of the interlayer is lowering the contact resistance between the n-type compound semiconductor layers and the upper electrodes 103.

From the perspective of improvement in conversion efficiency, the interlayer preferably has an average film thickness of 1 nm to 10 nm. The average film thickness of the interlayer is obtained from cross-sectional images of the photoelectric conversion devices. When the photoelectric conversion layer 102 is a heterojunction-type layer, a CdS layer of several tens nm or more, such as, for example, 50 nm in thickness is required as the buffer layer, and as the interlayer, a thinner film is provided on the n-type compound semiconductor layer. In the case of the photoelectric conversion devices 100A to 100C including the heterojunction photoelectric conversion layers 102, the film thickness comparable to the interlayer according to an embodiment is not preferred, because the conversion efficiency is decreased.

The interlayer is preferably a hard film from the perspective of improvement in conversion efficiency, and any method of solution growth methods (Chemical Bath Deposition: CBD), CVD methods, and physical vapor deposition methods (Physical Vapor Deposition: PVD) is preferred as the method for forming the hard film. The interlayer may be an oxide film as long as the film is a hard film. It is to be noted that the hard film means a high-density compact film. When the n-type compound semiconductor layers are damaged during the formation of the interlayer, surface recombination centers are formed, and thus, from perspective of low-damage film formation, the method for forming the interlayer is preferably a CBD method among the methods mentioned above. For the creation of a thin film such as from 1 nm to 10 nm, the film growth time may be shortened depending on the thickness. For example, under the film formation condition with the reaction time of 420 seconds, which is required for growing an interlayer of 60 nm by a CBD method, the reaction time may be adapted to 35 seconds in the case of forming an interlayer of, for example, 5 nm. As a method for adjusting the film thickness, it is also possible to alter the concentration of the prepared solution.

(Anti-Reflection Film)

In an embodiment, the anti-reflection film 104, which is a film provided to facilitate the introduction of light into the photoelectric conversion layer 102, is formed on the upper electrode 103. For example, $MgF_2$ or microlens (for example, from OPTMATE Corporation) is desirably used as the anti-reflection film 104. The anti-reflection films 104 typically have a thickness of 90 nm to 120 nm. The anti-reflection films 104 can be formed by, for example, an electron beam evaporation method.

In order to alleviate the influence on the solar cell or solar cell panel when one of the photoelectric conversion devices 100 is broken in the first solar cell A, it is preferable to provide a rectifying device (bypass diode). The provision of a bypass diode connected in parallel to the respective photoelectric conversion devices 100A to 100C can alleviate the influence on the solar cell, even when any of the photoelectric conversion devices 100A to 100C is broken. It is preferable to connect a bypass diode to the lower electrodes 101 and upper electrodes 103 of the respective photoelectric conversion devices 100A to 100C. The bypass diode and wiring thereof are preferably configured so as not to interfere with light into the photoelectric conversion layers 102.

A rectifying device (diode) may be connected in series with the first solar cell A. The diode connected in series has an anode connected to the lower electrode 101 which serves as a positive electrode of the first solar cell, or has a cathode connected to the upper electrode 103 which serves as a negative electrode of the first solar cell A. The diode connected in series with the first solar cell has the function of preventing backward flow of electricity when the open circuit voltage of the first solar cell A is lower than the open circuit voltage of the second solar cell B. Likewise, a series-connected diode may be also connected to the second solar cell B. The diode connected in series with the second solar cell B has an anode connected to a positive electrode of the solar cell, or has a cathode connected to a negative electrode of the first solar cell A. In this case, the diode functions in the same manner as the diode connected in series with the first solar cell A. The first solar cell A and second solar cell B may be both provided with a series-connected diode. In the case of using a bypass diode, the open circuit voltage of the solar cell may be decreased due to breakdown of any of the photoelectric conversion devices 100A to 100C, and also in this case, the series-connected diode functions when voltage matching is not maintained between the first solar cell A and the second solar cell B. The series-connected diode causes a voltage drop, and thus, from the perspective of conversion efficiency, the series-connected diode is preferably less likely to cause a voltage drop.

(Second Solar Cell B)

The second solar cell B includes multiple second photoelectric conversion devices. The second solar cell B serves as a bottom cell of the multi-junction solar cell. In FIG. 1, multiple second photoelectric conversion devices are denoted by 200A, 200B, 200C, 200D, 200E, and 200F. The second solar cell B has device isolation regions 207 between the respective series-connected photoelectric conversion devices A to F. While FIG. 1 has the form of the six photoelectric conversion devices A to F connected in series, the number of elements depends on the design. The second photoelectric conversion devices are solar cells in the form of having back contacts. The second photoelectric conversion devices have, on the surface of the insulating layer C opposite to the first solar cell, n-type or p-type silicon layers 201, p+ regions 202 exposed at the surfaces of the silicon layers 201 opposite to the insulating layer C, n+ regions 203 exposed at the surfaces of the silicon layers 201 opposite to the insulating layer C, p electrodes 204 connected to the p+ regions 202, and n electrodes 205 connected to the n+ regions 203. For example, the n electrode 205 of the second photoelectric conversion device 200A and the p electrode 204 of the second photoelectric conversion device 200B are connected through a wiring part 206 to connect the second photoelectric conversion devices 200A to 200F respectively in series. The p+ regions 202 and n+ regions 203 are situated at the back contact surfaces which are the rear surfaces of the second photoelectric conversion devices 200. The silicon layers 201 will be described as n-type silicon layers in an embodiment, but may be p-type.

The second solar cell B has, for example, the second photoelectric conversion devices 200A to 200F isolated respectively (for example, between the devices 200A and 200B). The devices are isolated by insulating the region between the second photoelectric conversion devices 200A and 200B. The device isolation can reduce leakage between the respective second photoelectric conversion devices 200A to 200F, and reduce power loss (current loss, voltage loss). For the device isolation regions 207, regions of the second photoelectric conversion devices 200A to 200F adjacent to each other for insulating the second photoelectric conversion devices adjacent to each other may be formed in the thickness direction of the silicon layers 201 (from the surfaces opposite to the insulating layer C toward the insulating layer C). The device isolation may be formed to account for 40% or more the cross-sectional areas between the second photoelectric conversion devices 200A to 200F connected in series. In device isolation of second photoelectric conversion devices connected in parallel, the devices are isolated in the same way as the isolation of the devices connected in series. The cross-sectional areas between the second photoelectric conversion devices 200A to 200F connected in series refer to the areas of cross sections perpendicular to imaginary lines connecting, with the shortest distance, the p electrodes and n electrodes connecting, in series, the second photoelectric conversion devices 200A to 200F adjacent to each other, and perpendicular to the back contact surfaces of the silicon layers 201. It is not preferable to account for less than 40%, because the narrower device isolation regions 207 exponentially decrease the effect of leakage reduction, and substantially lose the effect. The device isolation regions 207 may also exist in a part of the insulating layer C in some cases. More specifically, the device isolation regions 207 which are deeper than the film thickness of the silicon layers 201 may be formed in the multi-junction solar cell. When the insulating layer C has the device isolation regions 207, light is preferably scattered by a diffraction effect to increase the amount of light into the photoelectric conversion layers, and thus improve the conversion efficiency. The device isolation includes interference with conductivity, such as cutting of the silicon layers 201, groove formation in the silicon layers 201, and a decrease in mobility due to partially amorphous silicon single crystal. The cutting and groove formation include cutting with a dicer or the like and etching. The decrease in mobility can be achieved with ion beams. The gaps or grooves produced by cutting for the device isolation may be filled with an insulator. The step of carrying out the device isolation can be carried out before or after joining the first solar cell A and the second solar cell B with the insulating layer C. In the case of forming the device isolation regions 207 into the insulating layer C, from the perspective of joining precision, it is preferable to join the first solar cell A and the second solar cell B before forming the device isolation regions 207.

The increased device isolation regions 207 increase the number of the second photoelectric conversion devices which can be connected in series, and can increase the voltage generated by the cell. Through the adjustment of the voltage generated by the second solar cell B and the voltage matching between the first solar cell A and the second solar cell B, the multi-junction solar cell generates electricity corresponding to the product of the voltage and current values for each solar cell. However, the excessively increased device isolation regions 207 will decrease the volume of the silicon layers 201, and decrease the amount of light received by the silicon layers 201 to decrease the electricity (current) generated. Accordingly, the area of the device isolation regions 207 at the back contact surfaces is preferably 1% or less of the area of the back contact surfaces of the silicon layers 201.

The silicon layer 201 are p-type or n-type single-crystal silicon layers. The silicon layers 201 typically have a film thickness of 50 µm to 400 µm. The silicon layers 201 have the p+ regions 202 and the n+ regions 203. The silicon layers 201 contain dopants such as B, Al, N, P, and As. The silicon layers 201 form pn junctions with the p+ regions 202 or n+ regions 203 to serve as photoelectric conversion layers. An anti-reflection film may be provided between the silicon layers 201 and the insulating layer C.

The p+ regions 202 and the n+ regions 203 are regions obtained by making the silicon layers 201 n-type (n+) and p-type (p+) through, for example, an ion implantation or thermal diffusion method, and formed at the rear surfaces of the silicon layers 201 which are opposite to the insulating layer C. The p+ regions 202 and the n+ regions 203 each have a similar shape such as a U-shaped or comb-shaped form. The p+ regions 202 and the n+ regions 203 are arranged so as to engage with each other. There are preferably regions of the silicon layers 201 between the p+ regions 202 and the n+ regions 203 which have no contact with each other. The ion implantation is carried out in such a way that with the use of a mask, the silicon layers 201 are doped with a dopant such as B, Al, N, P, and As so as to form regions from 50 nm to 2 µm in depth, for example. The respective regions 202 and 203 preferably have dopant concentrations on the order of $1.0 \times 10^{19}$ cm$^{-3}$ to $1.0 \times 10^{20}$ cm$^{-3}$. The dopant concentrations in the p+ regions 202 and n+ regions 203 are higher than the impurity concentrations in the silicon layers 201.

The p+ regions 202 and n+ regions 203 respectively have p electrodes 204 and n electrodes 205. The p electrodes 204 and n electrodes 205 serve as back contact electrodes of the second solar cell B. The p electrodes 204 and n electrodes 205 serve as electrodes for connecting the photoelectric conversion devices 200 in parallel or in series, and in the case of providing a bypass diode, the p electrodes 204 and n electrodes 205 are connected to the diode. The electrodes are, for example, Cu or Al films on the order of 1 μm in thickness, which are deposited with the use of a mask.

It is preferable to provide a bypass diode in order to alleviate the influence on the solar cell or solar cell panel when any one of the photoelectric conversion devices 200A to 200F is broken in the second solar cell B. The provision of a bypass diode connected in parallel to the respective photoelectric conversion devices 200 can alleviate the influence on the solar cell, even when any of the photoelectric conversion devices 200A to 200F is broken. It is preferable to connect a bypass diode to the p electrodes 204 and n electrodes 205 of the respective photoelectric conversion devices 200. A diode may be formed by ion implantation into the silicon layer 201, or a diode may be externally attached.

The forms of device isolation, and multi-junction solar cells therein will be described with reference to FIGS. 2 through 6. The first solar cell A may have one device, or multiple devices connected in series.

Figure 2:
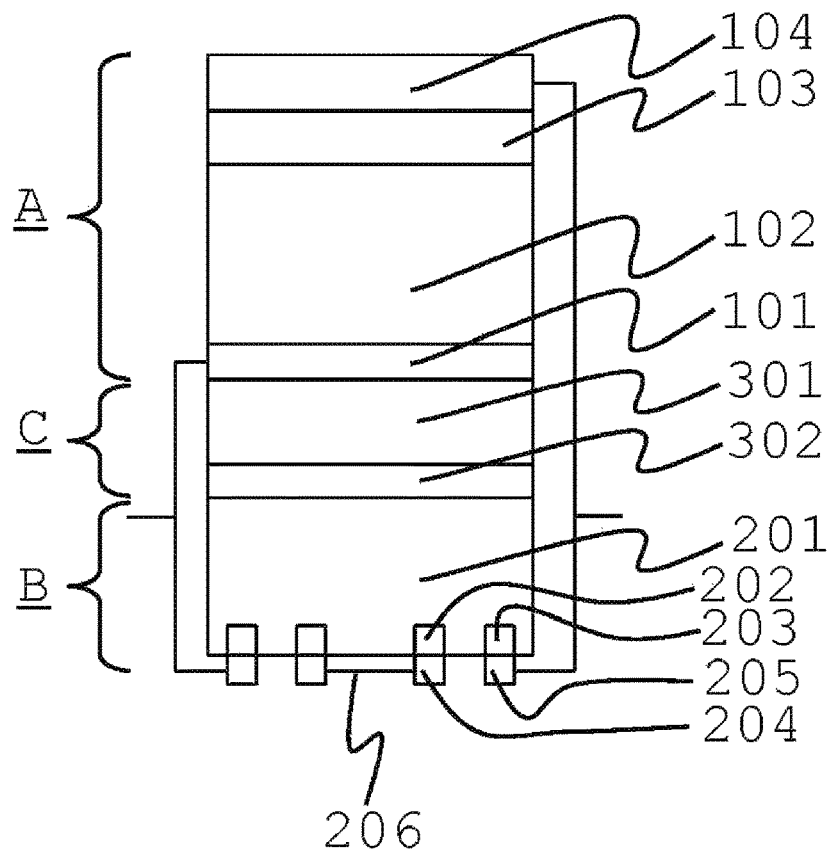
FIG. 2 is a conceptual diagram of a multi-junction solar cell according to an embodiment.

FIG. 2 shows a conceptual diagram of a multi-junction solar cell in the form in which two photoelectric conversion devices for the second solar cell B are not isolated. The multi-junction solar cell in FIG. 2 has the first solar cell A, an insulating layer C, and the second solar cell B. The second solar cell B has two photoelectric conversion devices connected in series. Because the two photoelectric conversion devices are not isolated, a back electromotive force relative to the photoelectric conversion devices is generated between the two photoelectric conversion devices. Because the back electromotive force partially cancels out electricity generated by the photoelectric conversion devices, the second solar cell B is low in conversion efficiency, furthermore, voltage matching is not achieved well between the first solar cell A and the second solar cell B, and thus, the multi-junction solar cell is also low in conversion efficiency.

Figure 3:
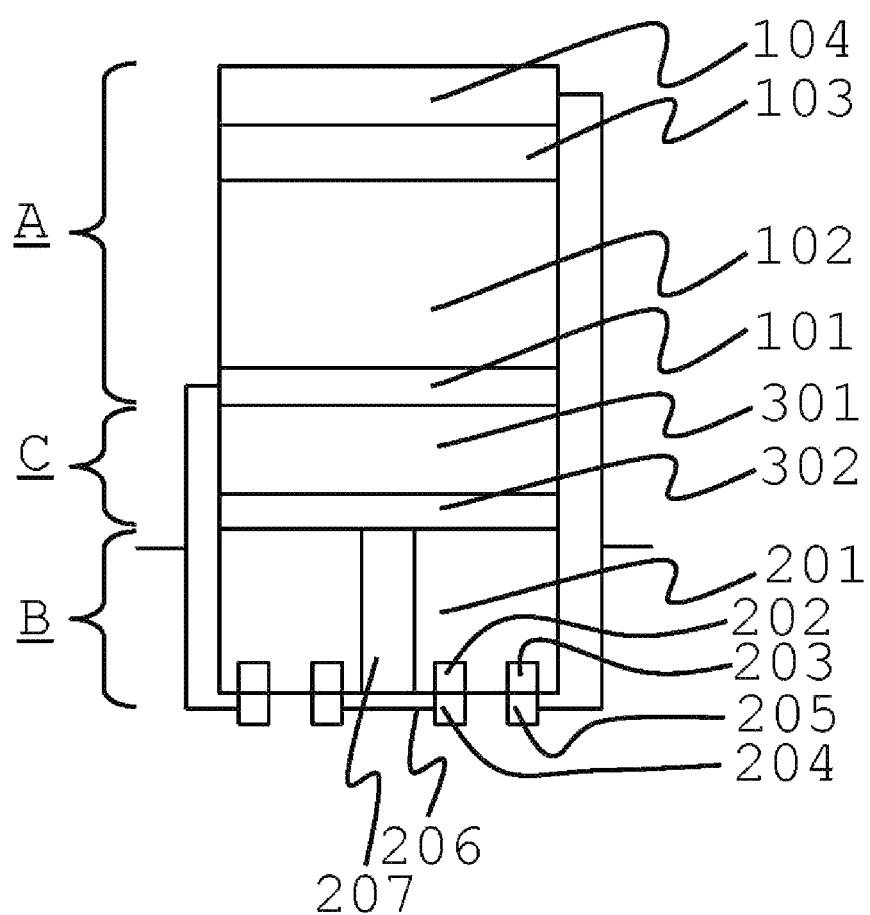
FIG. 3 is a conceptual diagram of a multi-junction solar cell according to an embodiment.

FIG. 3 shows a conceptual diagram of a multi-junction solar cell in the form in which two photoelectric conversion devices for the second solar cell B are isolated. The multi-junction solar cell in FIG. 3 is adapted in the same fashion as the multi-junction solar cell in FIG. 2, except for cutting between the second photoelectric conversion devices (for example, between devices 200A and 200B in FIG. 1) and the cut region filled with an insulator. The multi-junction solar cell in FIG. 3 has a device isolation region formed so as to achieve complete isolation between the photoelectric conversion devices of the second solar cell B, and thus generates no electromotive force between the photoelectric conversion devices. This form increases the open circuit voltage of the second solar cell B, and facilitates voltage matching between the first solar cell A and the second solar cell B. As for the second solar cell B, from the perspective of positioning accuracy, it is preferable to attach the first solar cell A, the insulating layer C, and the second solar cell B before the device isolation.

Figure 4:
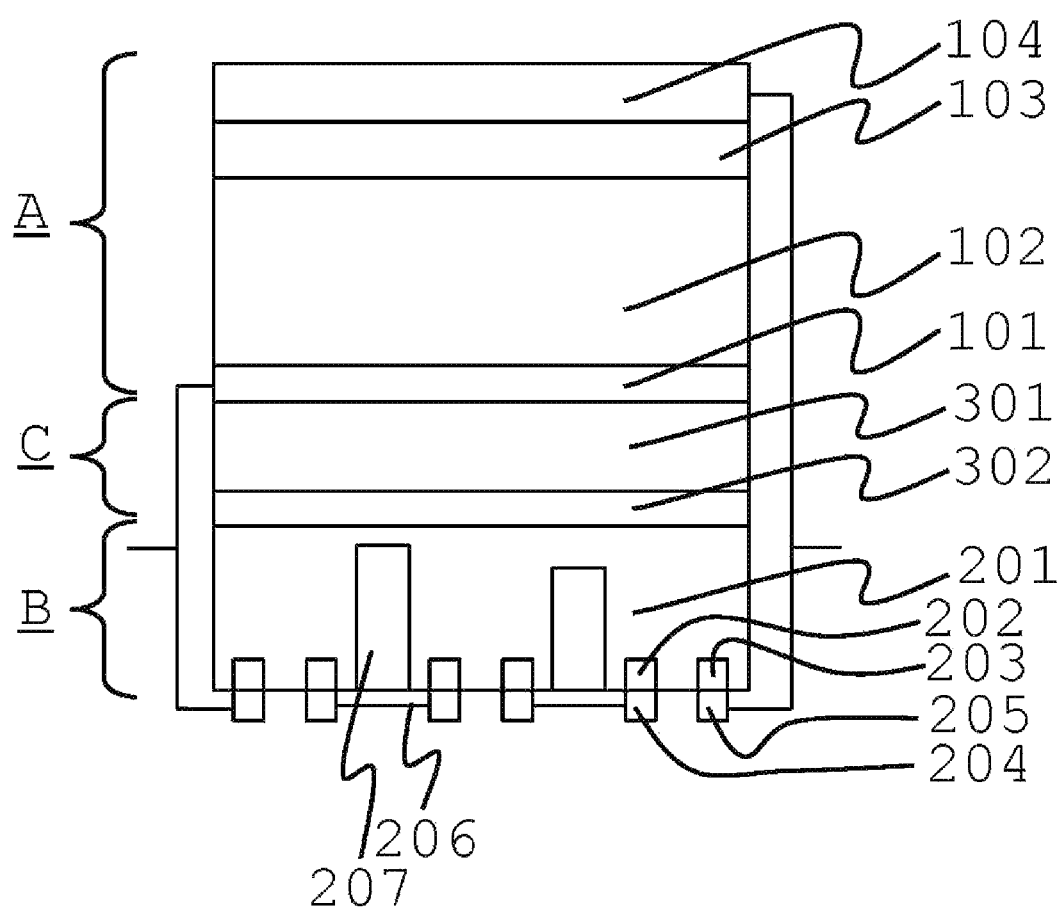
FIG. 4 is a conceptual diagram of a multi-junction solar cell according to an embodiment.

FIG. 4 shows a conceptual diagram of a multi-junction solar cell in the form in which three photoelectric conversion devices 200 for the second solar cell B are isolated. The multi-junction solar cell in FIG. 4 has incomplete cutting between the second photoelectric conversion devices (for example, between the respective devices 200A to 200C in FIG. 1), and the cut regions filled with an insulator to isolate the second photoelectric conversion devices. The device isolations in the two regions differ in depth. While the device isolations preferably have the form of completely separating the silicon layers 201, voltage leakage between the second photoelectric conversion devices can be reduced even in the case of the incomplete separations. In FIG. 4, the device isolation region on the left-hand side is deeper than that on the right-hand side, and the left region between the photoelectric conversion devices is thus more effective for reducing voltage/current leakage. This form increases the open circuit voltage of the second solar cell B, and facilitates voltage matching between the first solar cell A and the second solar cell B. It is also possible to adjust the open circuit voltage of the second solar cell B, depending on the depth of the device isolation. For the second solar cell B in this form, the device isolation is incompletely achieved, and it is thus also preferable to attach the first solar cell A, the insulating layer C, and the second solar cell B after the device isolation.

Figure 5:
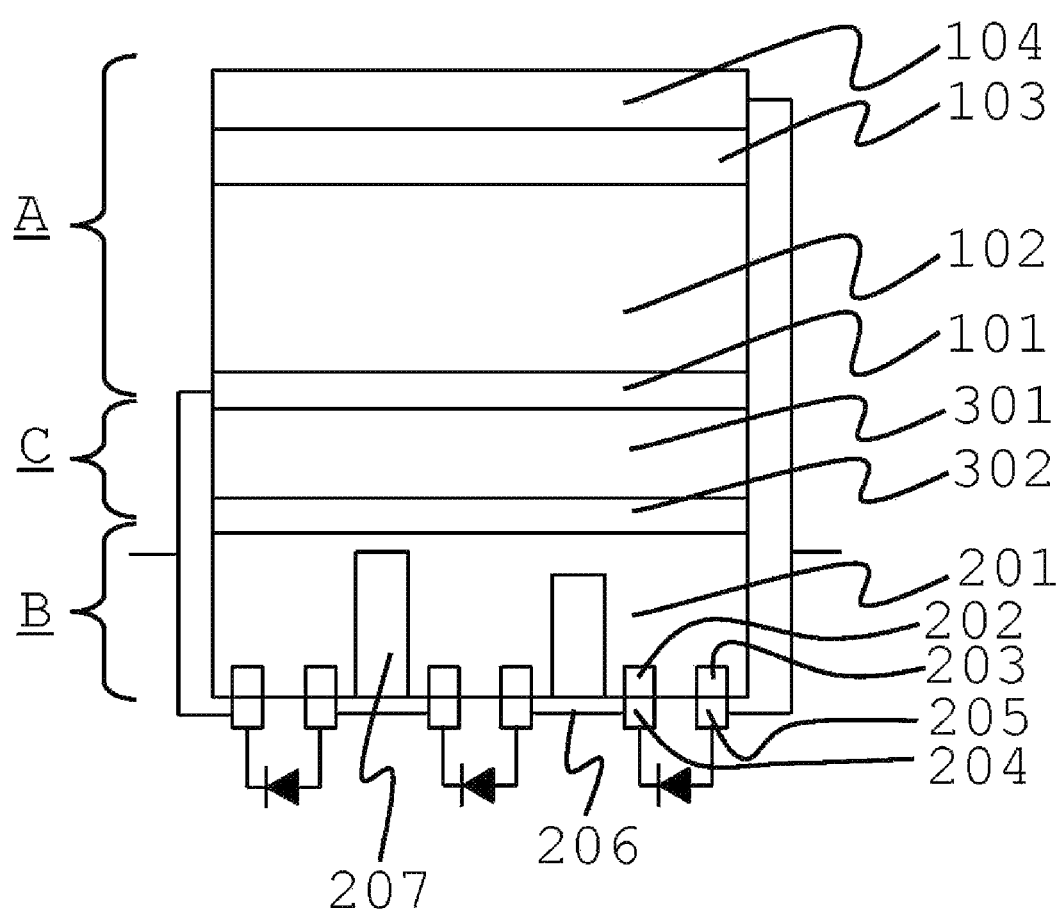
FIG. 5 is a conceptual diagram of a multi-junction solar cell according to an embodiment.

FIG. 5 shows a conceptual diagram of a multi-junction solar cell in the form in which three photoelectric conversion devices for the second solar cell B are isolated, and a rectifying device (diode) is provided between a p electrode 204 and an n electrode 205 for each photoelectric conversion device. The multi-junction solar cell in FIG. 5 has the form of the three photoelectric conversion devices respectively provided with bypass diodes, unlike the multi-junction solar cell in FIG. 4. The solar cell configured in this way is able to generate electricity as the second solar cell B, even when any of the photoelectric conversion devices is broken to turn into an insulated condition, because of the flow of electricity through the bypass diodes.

Figure 6:
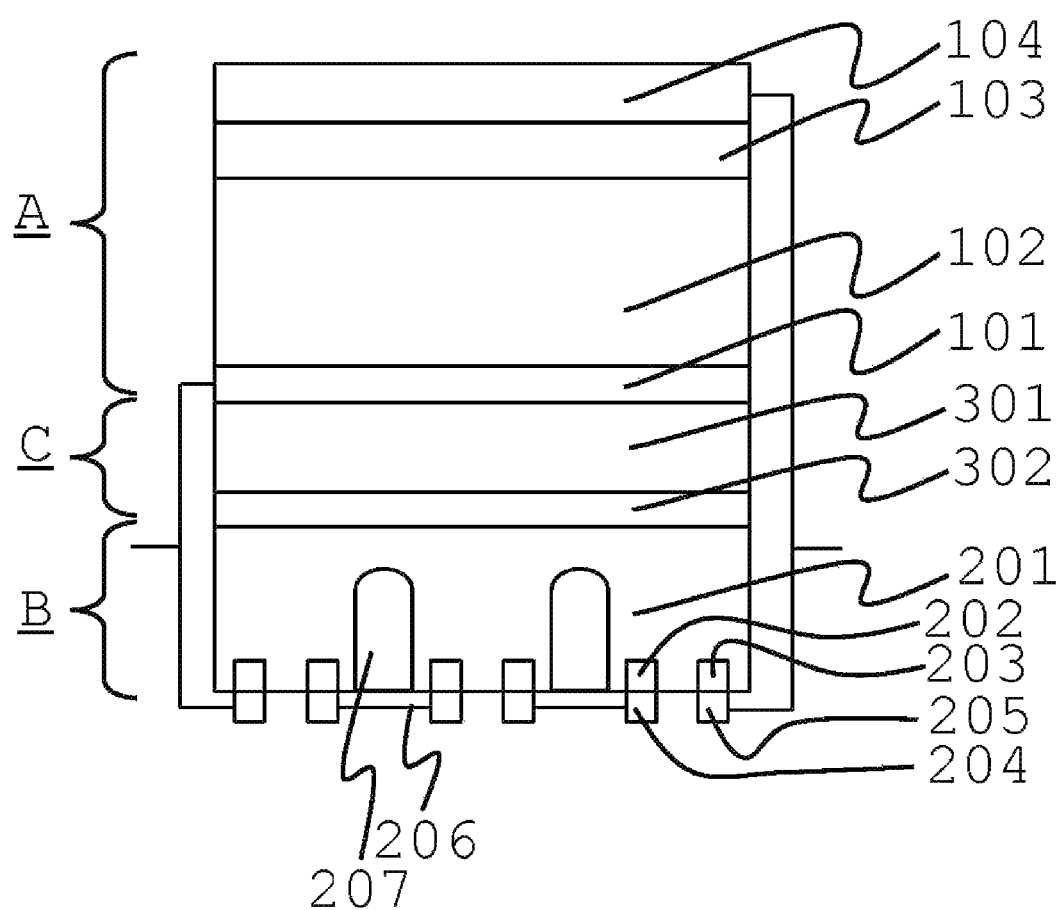
FIG. 6 is a conceptual diagram of a multi-junction solar cell according to an embodiment.

FIG. 6 shows a conceptual diagram of a multi-junction solar cell in the form in which three photoelectric conversion devices for the second solar cell B are isolated by carrying out device isolation of making single-crystal silicon amorphous with the use of ion beams. The multi-junction solar cell in FIG. 6 has the form of mobility decreased by irradiating silicon layers between the photoelectric conversion devices with ion beams to make the silicon layers 201 between the photoelectric conversion devices amorphous, instead of insulating regions formed between the photoelectric conversion devices, unlike the multi-junction solar cell in FIG. 4. Because of the decreased mobility rather than insulation, the second solar cell B achieves on the order of 10% of current in the case of complete device isolation, but the conversion efficiency of the multi-junction solar cell can be increased as compared with the form without device isolation, because voltage matching can be achieved between the first solar cell A and the second solar cell B.

When wiring parts 206 for connections between the photoelectric conversion devices cross over the silicon layers 201 besides the p+ regions 202 and the n+ regions 203, an insulating film is preferably provided on the silicon layers 201 to reduce leakage. The insulating film is typically $SiO_2$ formed with the use of a mask.

The wiring parts 206 connect the p electrodes 204 and n electrodes 205 of adjacent photoelectric conversion devices to connect the photoelectric conversion devices in series. For the wiring parts 206 which are formed on the back contact surfaces, a metal film such as, for example, Cu and Al can be thus used in the same manner as the p electrodes 204 and n electrodes 205.

While the second solar cell B has been described as a bottom cell in the embodiment, the series wiring and device isolation according to the embodiment can be applied for front contacts in the case of a multi-junction solar cell with the second solar cell B as a top cell. When the second solar cell is adopted as a top cell, it is preferable to use a transparent member for the electrodes and wirings of the second solar cell B.

(Insulating Layer C)

The insulating layer C is an insulating layer for joining the first solar cell A and the second solar cell B. The insulating layer C is, for example, soda-lime glass, quartz, glass, a resin layer (including an adhesive layer), or a laminated body with the use of these members. The insulating layer C of the multi-junction solar cell in FIG. 1 includes blue sheet glass 301 and an acrylic resin adhesive layer 302. The insulating layer C connects the first solar cell A and the second solar cell B, and transmits light passing through the first solar cell A to guide the light to the second solar cell B. For example, acrylic binders can be used as the adhesive. The device isolation regions 207 of the second solar cell B may be formed in the insulating layer C in some cases.

A multi-junction solar cell according to an embodiment will be more specifically described below with reference to examples.

EXAMPLE 1

In Example 1, a multi-junction solar cell is prepared in the form shown in the conceptual diagram of FIG. 3. First, a first solar cell is prepared on soda-lime glass to serve as a part of the insulating layer. With the use of soda-lime glass of 1 cm×1 cm with an ITO film of 200 nm in thickness formed thereon, a $Cu_{0.85}(In_{0.12}Ga_{0.59}Al_{0.29})(S_{0.1}Se_{0.9})_2$ thin film to serve as a photoelectric conversion layer is deposited by a deposition method (three-step method). First, the substrate temperature is increased to 300° C., and Al, In, Ga, S, and Se are deposited (first step). Thereafter, the substrate temperature is increased to 500° C., and Cu, S, and Se are deposited. The initiation of an endothermic reaction is confirmed, and the deposition of Cu is stopped once on reaching a composition with excessive Cu (second step). Immediately after the deposition is stopped, Al, In, Ga, S, and Se are again deposited (third step) to provide a composition with slightly excessive Group IIIb element such as Al, In, or Ga. The photoelectric conversion layer has a film thickness on the order of approximately 2000 nm.

In order to make the obtained photoelectric conversion layer partially n-type, the member after the deposition of the photoelectric conversion layer is immersed in a 25% ammonia solution with 0.08 mM cadmium sulfate dissolved therein, and reacted at room temperature (25° C.) for 22 minutes. Thus, an n-type semiconductor layer doped with Cd is formed in a region of the photoelectric conversion layer on the order of 100 nm in depth on the side on which an upper electrode is to be formed. On the n-type semiconductor layer, a CdS contact layer and an i-ZnO thin film as a semi-insulating layer are deposited by spin coating. Subsequently, on the semi-insulating layer, deposition on the order of 300 nm is carried out by sputtering with the use of a ZnO:Al target containing 2 wt % of alumina ($Al_2O_3$) to serve as an upper electrode. Finally, as an anti-reflection film, $MgF_2$ on the order of 105 nm is deposited by an electron beam evaporation method to prepare the first solar cell on the soda-lime glass.

Next, a second solar cell is prepared. One surface of an n-type single-crystal silicon layer of 200 μm in thickness is partially made p+ type and n+ type by partial ion implantation with a B element and a P element respectively into separate regions so as to have a concentration of $2.0×10^{-19}$ $cm^{-3}$, a depth of 0.2 μm, and a width of 300 μm. The p+ type and n+ type are imparted to form two p+ regions and two n+ regions in the order of p+, n+, p+, and n+ at the back contact side of the silicon layer. Thus, two photoelectric conversion devices are formed. There are regions subjected to the ion implantation between the p+ regions and the n+ regions. On the p+ regions and the n+ regions, Cu of 1 μm is deposited asp electrodes and n electrodes with the use of a mask to prepare the second solar cell.

Next, with the use of an acrylic resin as an adhesive, the surface of the silicon layer of the second solar cell, which is opposite to the surface with the n+ regions and p+ regions, is joined to the surface of the soda-lime glass with the first solar cell, which is opposite to the surface with the first solar cell. The adhesive layer has a thickness on the order of 50 μm. In the silicon layer of the joined member, a region between the two photoelectric conversion devices is cut with the use of a dicer in a direction from the back contact side of the silicon layer to the first solar cell over the silicon layer length of 1 cm from end to end to isolate the photoelectric conversion devices of the silicon layer. The cutting depth is 200 μm, which is equal to the thickness of the silicon layer, and the cutting width is 15 μm. The gap produced by cutting the silicon layer is filled with an acrylic resin.

Figure 7:
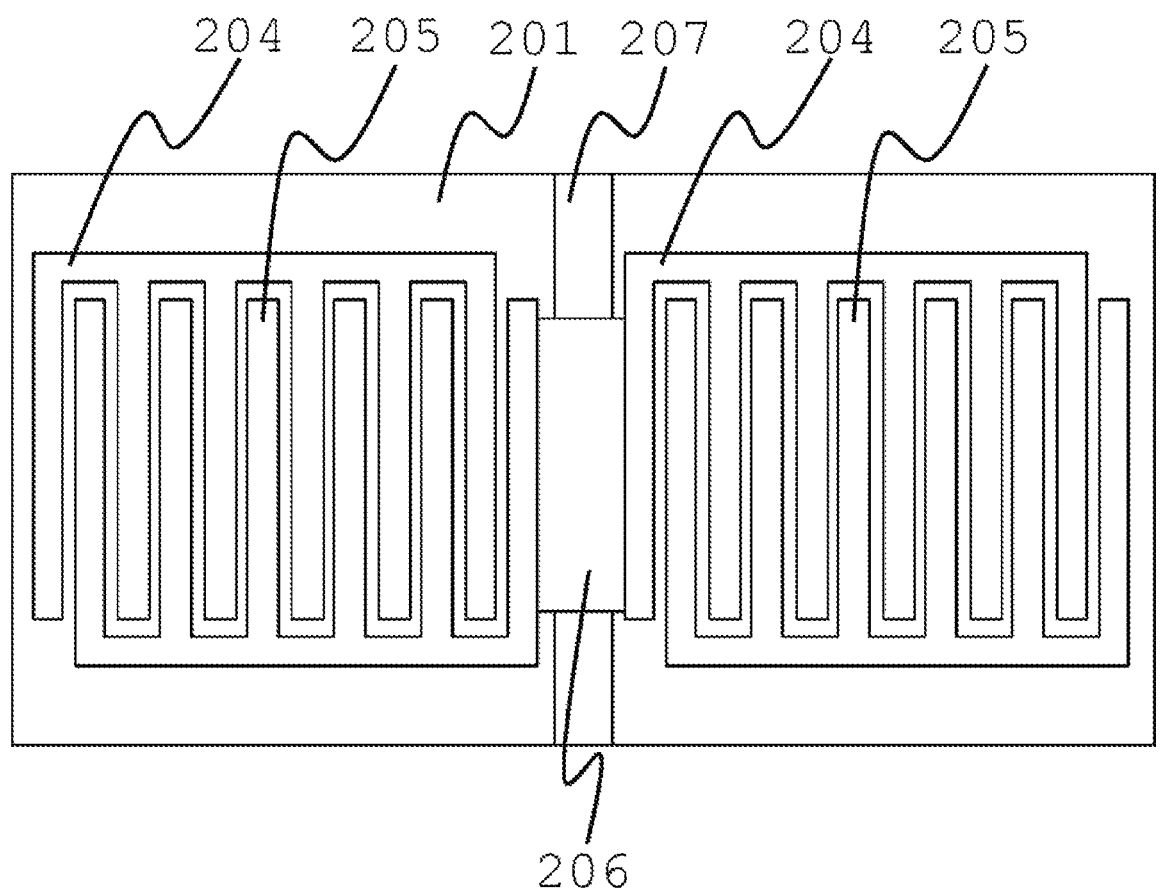
FIG. 7 is a conceptual diagram of a back contact of a multi-junction solar cell according to an example.

Next, the electrodes on the n+ region and p+ region adjacent to the device isolation region are wired with Cu to connect the photoelectric conversion devices in series, thereby preparing the multi-junction solar cell according to Example 1. The conceptual diagram of FIG. 7 shows a back contact surface of a silicon layer with p+ regions and n+ regions formed. The ITO electrode, upper electrode, p+ region, and n+ region of the first solar cell are connected to a semiconductor parameter analyzer to measure each of the open circuit voltage (Voc), short-circuit current density (Jsc), and conversion efficiency (η) for the first solar cell alone, the second solar cell alone with the first solar cell formed, and further the multi-junction solar cell of the first solar cell and second solar cell connected in parallel under quasi-sunlight irradiation of AM1.5 through a solar simulator. The measured results are shown in Table 1. The conversion efficiency η is calculated from the formula η=Voc·Jsc·FF/P·100, where Voc is an open circuit voltage, Jsc is a short-circuit current density, FF is a power factor, and P is an incident power density.

EXAMPLE 2

Except for cutting down to a depth of 180 μm in a direction from the surface with the p+ regions and n+ regions formed to the first solar cell in the device isolation, a multi-junction solar cell is prepared in the same way as in Example 1. On the multi-junction solar cell according to Example 2, the open circuit voltage, short-circuit current density, and conversion efficiency are also measured in the same way as in Example 1. The measured results are shown in Table 1.

EXAMPLE 3

Except for cutting down to a depth of 80 μm in a direction from the surface with the p+ regions and n+ regions formed to the first solar cell in the device isolation, a multi-junction solar cell is prepared in the same way as in Example 1. On the multi-junction solar cell according to Example 3, the open circuit voltage, short-circuit current density, and conversion efficiency are also measured in the same way as in Example 1. The measured results are shown in Table 1.

EXAMPLE 4

Except for cutting down to a depth of 210 µm in a direction from the surface with the p+ regions and n+ regions formed to the first solar cell in the device isolation, and forming the device isolation region even down to the acrylic resin, a multi-junction solar cell is prepared in the same way as in Example 1. On the multi-junction solar cell according to Example 4, the open circuit voltage, short-circuit current density, and conversion efficiency are also measured in the same way as in Example 1. The measured results are shown in Table 1.

EXAMPLE 5

Figure 8:
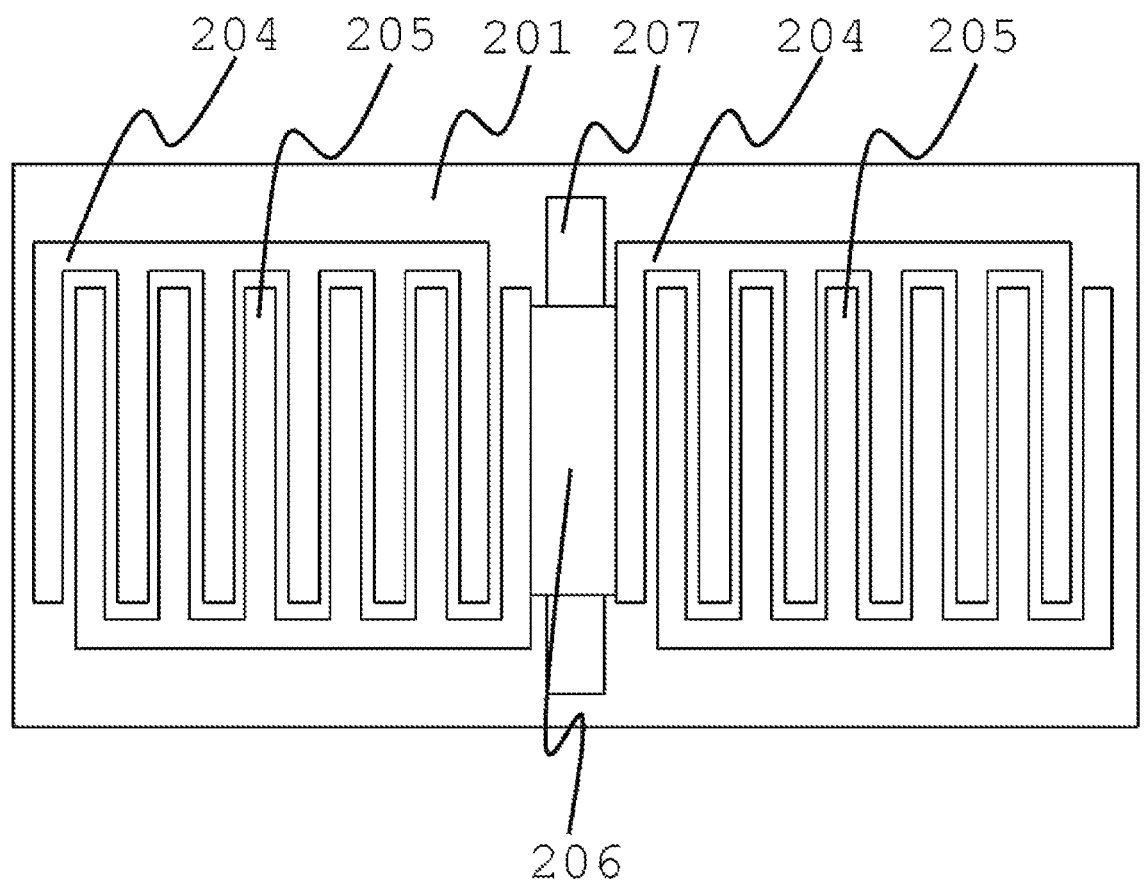
FIG. 8 is a conceptual diagram of a back contact of a multi-junction solar cell according to an example.

Except for cutting with a dicer so as not to cut 0.5 mm each for both ends of the silicon layer as shown in the conceptual diagram of FIG. 8 in the device isolation, a multi-junction solar cell is prepared in the same way as in Example 1. The length of the region with the silicon layer left without being cut accounts for 10% in total, i.e., 5% of the cutting length in Example 1 for each of the two regions. On the multi-junction solar cell according to Example 5, the open circuit voltage, short-circuit current density, and conversion efficiency are also measured in the same way as in Example 1. The measured results are shown in Table 1.

Comparative Example 1

Except that the device isolation is not carried out, a multi-junction solar cell is prepared in the same way as in Example 1. On the multi-junction solar cell according to Comparative Example 1, the open circuit voltage, short-circuit current density, and conversion efficiency are also measured in the same way as in Example 1. The measured results are shown in Table 1.

TABLE 1A

| | First Solar Cell | | | Second Solar Cell | | |
| --- | --- | --- | --- | --- | --- | --- |
| | Voc (V) | Jsc (mA) | η (%) | Voc (V) | Jsc (mA) | η (%) |
| Example 1 | 1.2 | 16 | 15.3 | 1.3 | 12 | 12.1 |
| Example 2 | 1.2 | 16 | 15.3 | 1.1 | 10 | 7.7 |
| Example 3 | 1.2 | 16 | 15.3 | 1.0 | 7 | 5.3 |
| Example 4 | 1.2 | 16 | 15.3 | 1.3 | 12 | 12.2 |
| Example 5 | 1.2 | 16 | 15.3 | 1.1 | 10 | 7.7 |
| Comparative Example 1 | 1.2 | 16 | 15.3 | 0.7 | 21 | 10.3 |

TABLE 1B

| | Multi-Junction Solar Cell | | |
| --- | --- | --- | --- |
| | Voc(V) | Jsc(mA) | η(%) |
| Example 1 | 1.2 | 27 | 24.6 |
| Example 2 | 1.1 | 26 | 19.5 |
| Example 3 | 1.0 | 17 | 16.3 |
| Example 4 | 1.2 | 27 | 24.7 |

TABLE 1B-continued

| | Multi-Junction Solar Cell | | |
| --- | --- | --- | --- |
| | Voc(V) | Jsc(mA) | η(%) |
| Example 5 | 1.1 | 26 | 19.5 |
| Comparative Example 1 | 0.7 | 35 | 18.4 |

Example 1 indicates intended performance of an almost twofold increase in the voltage of the second solar cell and a decrease in current value to almost one-half, with respect to the voltage a cell without serial connection. It can be understood that Example 2 causes losses in both voltage and current, due to the presence of the leakage component. It can be understood that incomplete device isolation interferes with the improvement in efficiency in Example 3. Examples 4 and 5 have current values slightly increased as compared with Example 1. This is believed to be due to the fact that light that is not absorbed by the cut section is diffusely reflected and absorbed by the surrounding cell. For example, when scribing is carried out before the adhesive is fully hardened, the cut section formed in the adhesive may deviate from the cut section of the underlayer solar cell in some cases, but the increase in current can be expected as long as the sections are partially overlapped. In addition, even when a portion of the cut section is not completely cut, the form is considered effective as long as the portion is not a significant source of leakage. (for example, when the cutting depth is 90% only at a point of the cut section)

Comparative Example 1 has achieved almost no improvement in the voltage of the second solar cell. This is due to the fact that any series structure is not achieved because of carrying out no device isolation. Because the shape of the lower electrode differs in pattern from the shape without series connection, some of photons absorbed are recombined to also fail to earn the current value, thereby resulting in the low efficiency. When the results are compared between each example and Comparative Example 1, it can be understood that voltage matching is unable to be achieved without device isolation, and halfway device isolation is unlikely to achieve the effect of increasing the efficiency, due to the leakage component.

EXAMPLE 6

Figure 9:
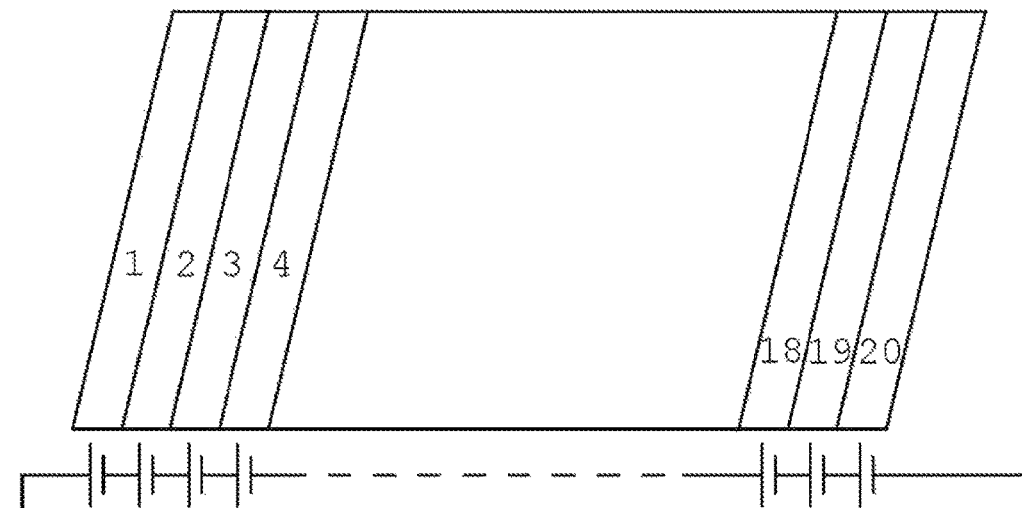
FIG. 9 is a conceptual diagram of and a circuit of a multi-junction solar cell according to an example
Figure 9:
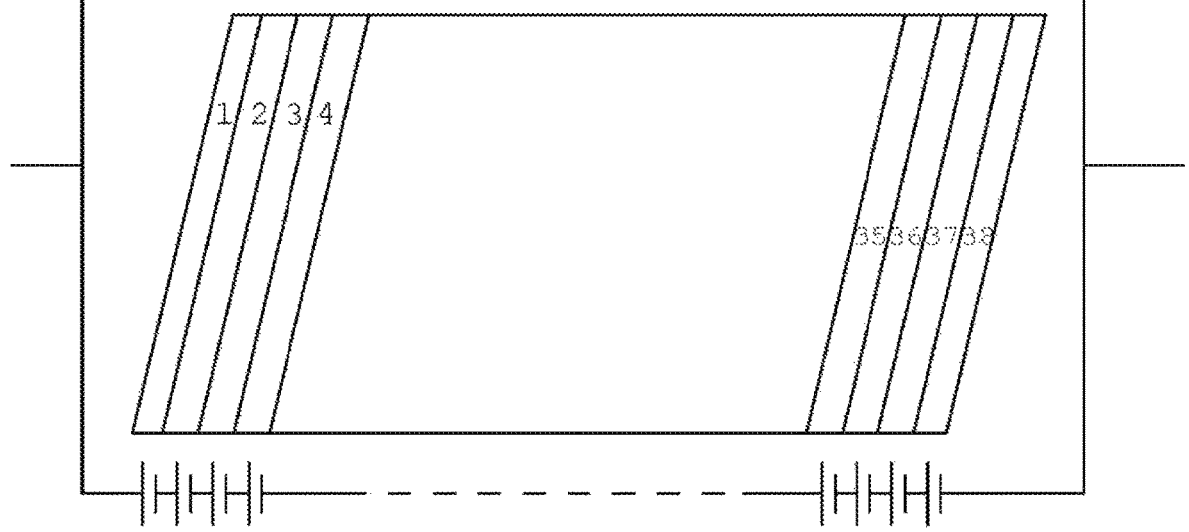

On a substrate of 12 cm×12 cm, an ITO electrode is divided by scribing into parts for twenty devices, and a photoelectric conversion layer is deposited on the ITO electrode. The photoelectric conversion layer is subjected to scribing so as to be divided into twenty equal parts for photoelectric conversion devices, an upper electrode is formed so as to connect the twenty photoelectric conversion devices in series, and subjected to scribing, and then, an anti-reflection film is further formed to prepare the first solar cell with the twenty photoelectric conversion devices connected in series. Then, in a silicon layer of 12 cm×12 cm, thirty-eight regions for each of p+ and n+ are formed by ion implantation to prepare thirty-eight second photoelectric conversion devices which are equal in area to each other. After this layer is joined to the substrate with the first solar cell formed, the thirty-eight second photoelectric conversion devices are subjected to device isolation by cutting with a dicer. Except for the preparation of the second solar cell where the second photoelectric conversion devices subjected to the device isolation are all connected in series, a multi-junction solar cell is prepared in the same way as in Example 1. FIG. 9 shows a conceptual diagram of and a circuit of the prepared multi-junction solar cell. The numerical numbers in FIG. 9 refers to numbers for the photoelectric conversion devices. The numerical numbers indicate that the first solar cell has the twenty photoelectric conversion devices, whereas the second solar cell has the thirty-eight photoelectric conversion devices. On the multi-junction solar cell according to Example 6, the open circuit voltage, short-circuit current density, and conversion efficiency are also measured in the same way as in Example 1. The measured results are shown in Table 2.

EXAMPLE 7

Figure 10:
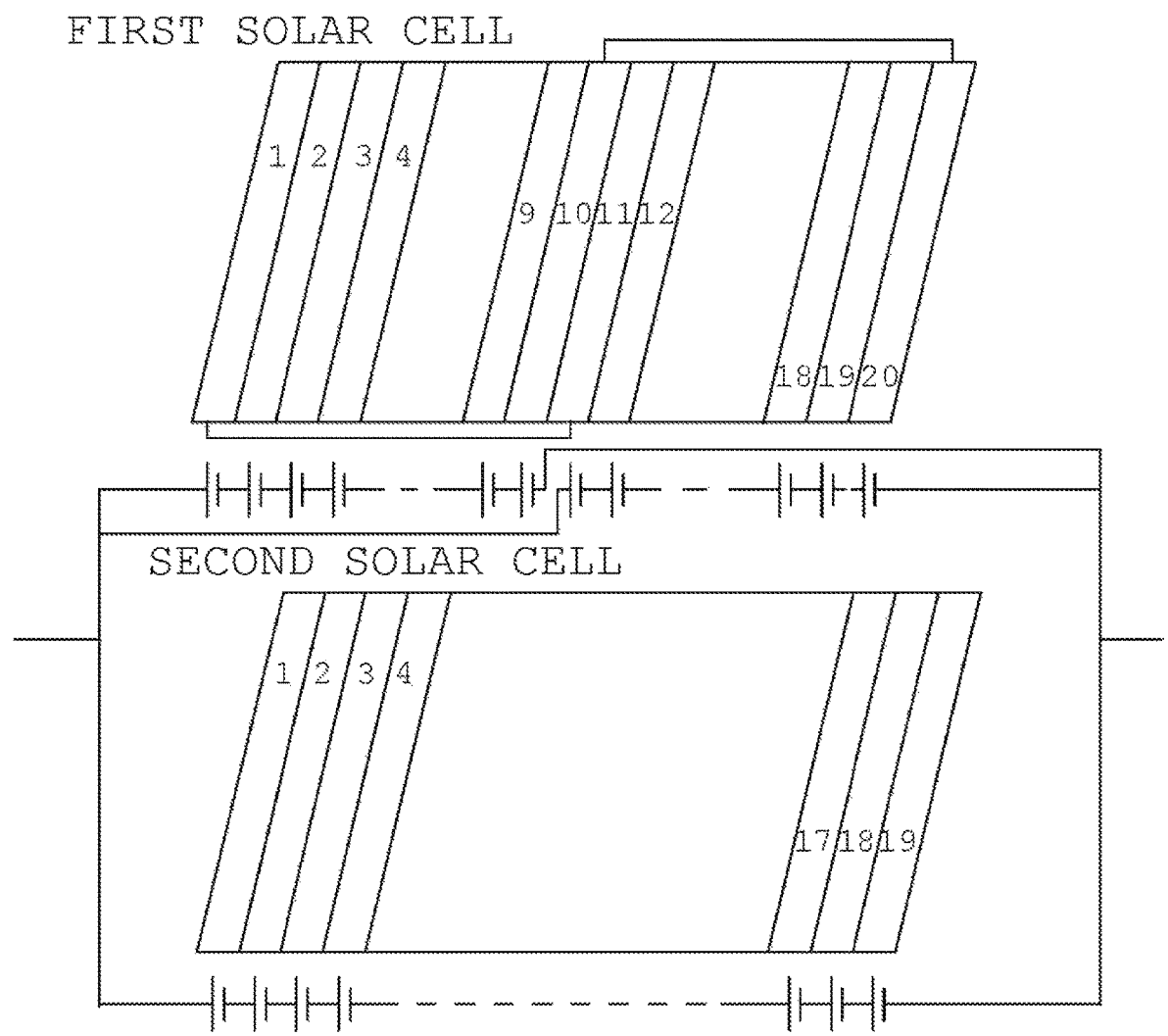
FIG. 10 is a conceptual diagram of and a circuit of a multi-junction solar cell according to an example.

On a substrate of 12 cm×12 cm, a photoelectric conversion layer is formed which is divided into twenty equal parts by scribing. Thereafter, an upper electrode is formed so as to connect ten photoelectric conversion devices in series, i.e., photoelectric conversion devices 1 to 10 in series and photoelectric conversion devices 11 to 20 in series. In this case, the photoelectric conversion devices 10 and 11 are not connected in series or in parallel. Furthermore, an anti-reflection film is formed. The two sets of ten photoelectric conversion devices connected in series are connected in parallel to prepare the first solar cell. Then, in a silicon layer of 12 cm×12 cm, nineteen regions for each of p+ and n+ are formed by ion implantation to prepare nineteen second photoelectric conversion devices which are equal in area to each other, the layer is bonded to the substrate with the first solar cell formed, and the nineteen second photoelectric conversion devices are then subjected to device isolation by cutting with a dicer. Except for the preparation of the second solar cell where the second photoelectric conversion devices subjected to the device isolation are all connected in series, a multi-junction solar cell is prepared in the same way as in Example 1. FIG. 10 shows a conceptual diagram of and a circuit of the prepared multi-junction solar cell. On the multi-junction solar cell according to Example 7, the open circuit voltage, short-circuit current density, and conversion efficiency are also measured in the same way as in Example 1. The measured results are shown in Table 2.

EXAMPLE 8

Figure 11:
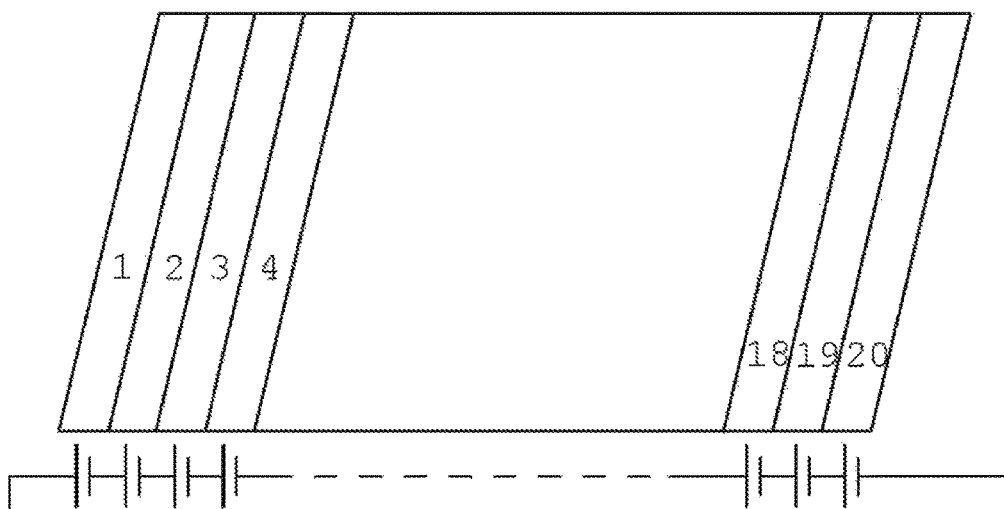
FIG. 11 is a conceptual diagram of and a circuit of a multi-junction solar cell according to an example.
Figure 11:
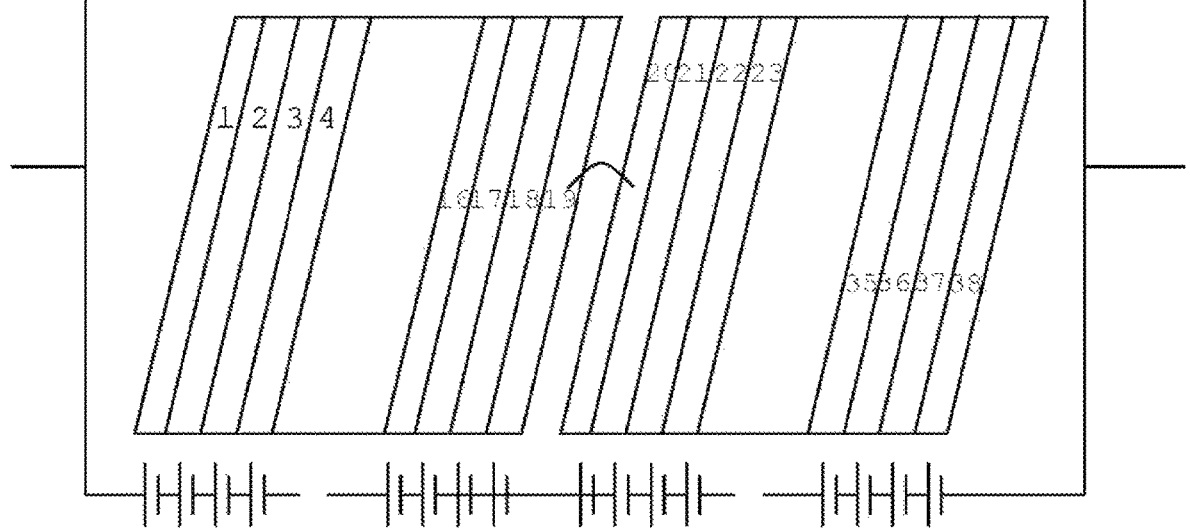

On a substrate of 12 cm×12 cm, an ITO electrode is divided by scribing into parts for twenty devices, and a photoelectric conversion layer is deposited on the ITO electrode. The photoelectric conversion layer is subjected to scribing so as to be divided into twenty equal parts for photoelectric conversion devices, an upper electrode is formed so as to connect the twenty photoelectric conversion devices in series, and an anti-reflection film is further formed to prepare the first solar cell with the twenty photoelectric conversion devices connected in series. Then, a silicon layer of 12 cm×5.5 cm is subjected to ion implantation to form nineteen regions for each of p+ and n+. The silicon layer subjected to the ion implantation is bonded to the substrate with the first solar cell formed. Then, the silicon layer is subjected to device isolation by cutting with a dicer to two sets of nineteen photoelectric conversion devices which are equal in area to each other. Then, except that the two sets of second photoelectric conversion devices are connected in series to prepare the second solar cell, a multi-junction solar cell is prepared in the same way as in Example 1. FIG. 11 shows a conceptual diagram of and a circuit of the prepared multi-junction solar cell. On the multi-junction solar cell according to Example 8, the open circuit voltage, short-circuit current density, and conversion efficiency are also measured in the same way as in Example 1. The measured results are shown in Table 2.

EXAMPLE 9

Figure 12:
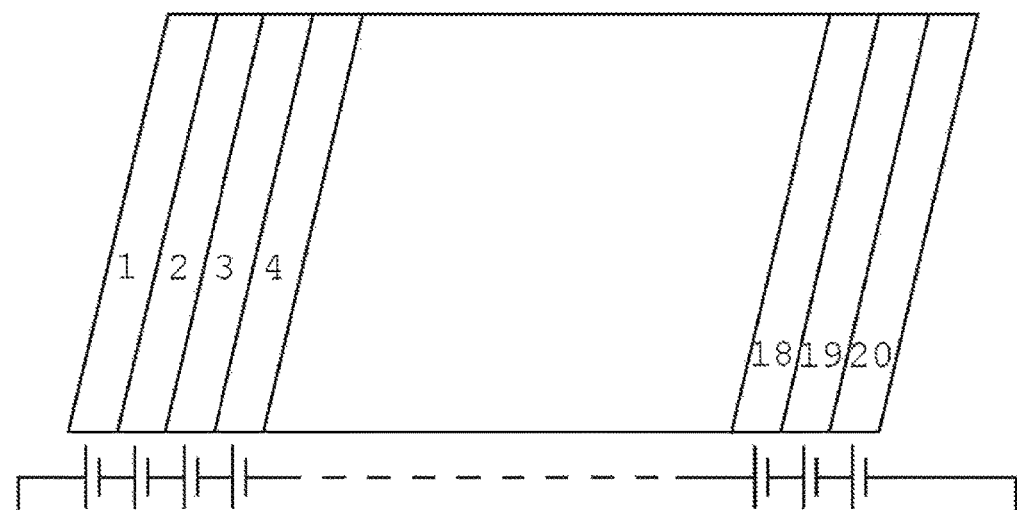
FIG. 12 is a conceptual diagram of and a circuit of a multi-junction solar cell according to an example.
Figure 12:
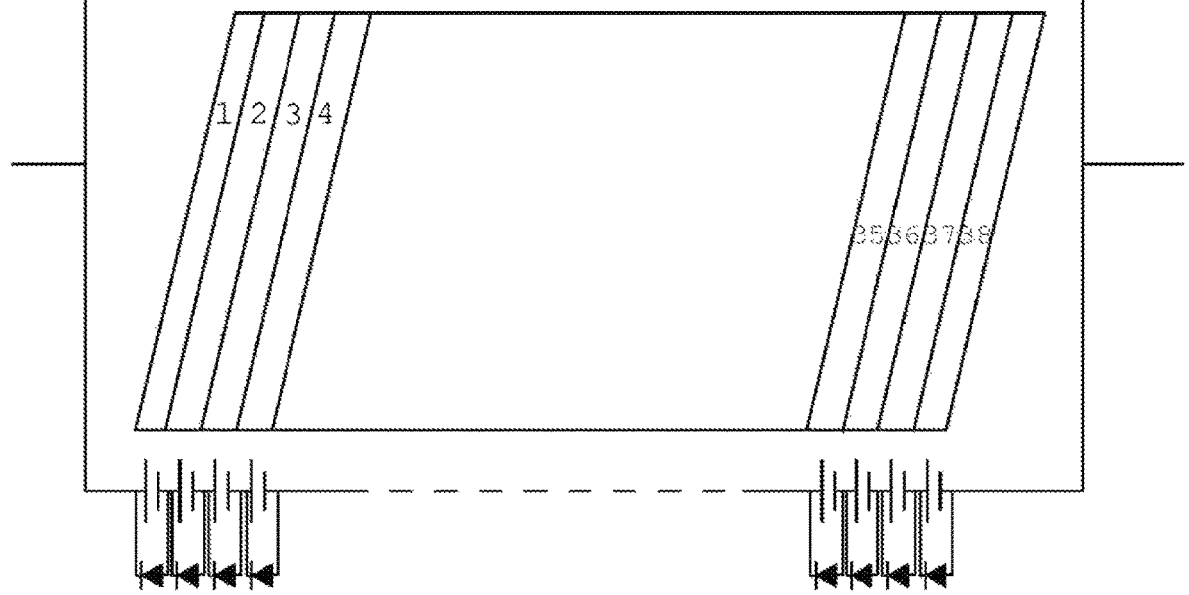

Example 9 provides a multi-junction solar cell where the second photoelectric conversion devices according to Example 6 are provided with bypass diodes. Cathodes of the diodes are connected to p electrodes of the second photoelectric conversion devices, whereas anodes thereof are connected to n electrodes of the second photoelectric conversion devices. The bypass diodes are diodes externally attached, rather than formed in the silicon layers of the second photoelectric conversion devices. FIG. 12 shows a conceptual diagram of the prepared multi-junction solar cell according to Example 9. On the prepared multi-junction solar cell, the open circuit voltage, short-circuit current density, and conversion efficiency are measured in the same way as in Example 1. The measured results are shown in Table 2.

Comparative Example 2

Figure 13:
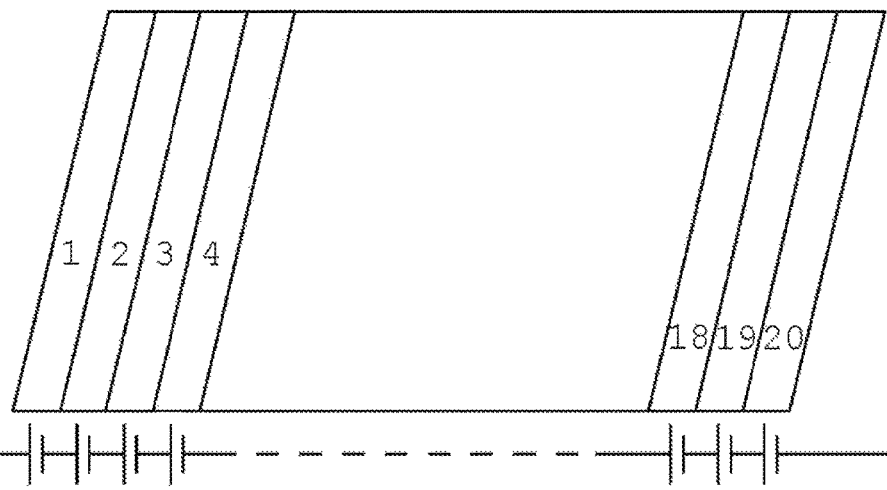
FIG. 13 is a conceptual diagram of and a circuit of a multi-junction solar cell according to a comparative example.
Figure 13:
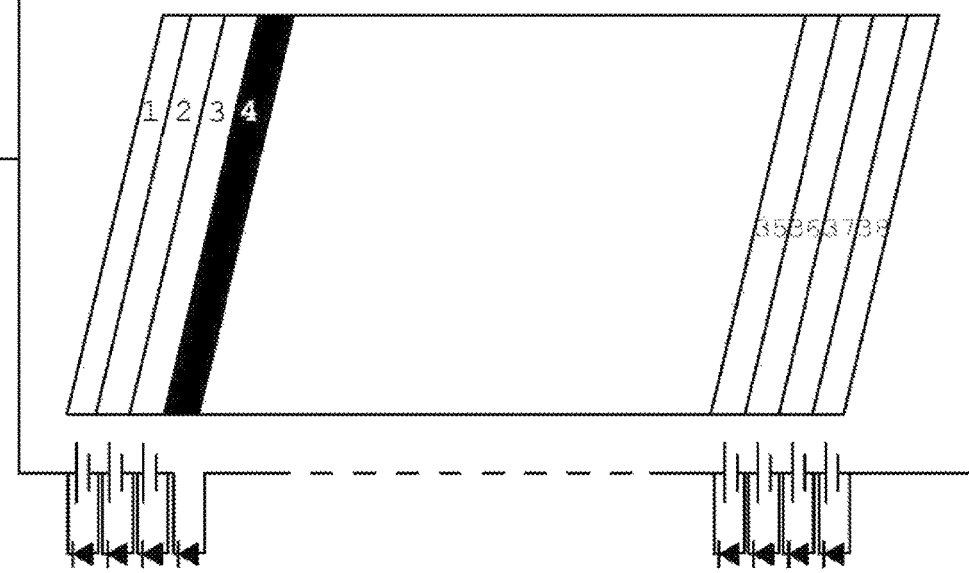

In the device isolation with a dicer, one of second photoelectric conversion devices is all removed. Also with the formation of an electrode in the place of the photoelectric conversion device removed therefrom, a multi-junction solar cell is prepared in the same way as in Example 9. FIG. 13 shows a conceptual diagram of and a circuit of the prepared multi-junction solar cell. The blacked region with a white letter refers to a region without any photoelectric conversion device. On the prepared multi-junction solar cell according to Comparative Example 2, the open circuit voltage, short-circuit current density, and conversion efficiency are measured in the same way as in Example 1. The measured results are shown in Table 2.

EXAMPLE 10

Figure 14:
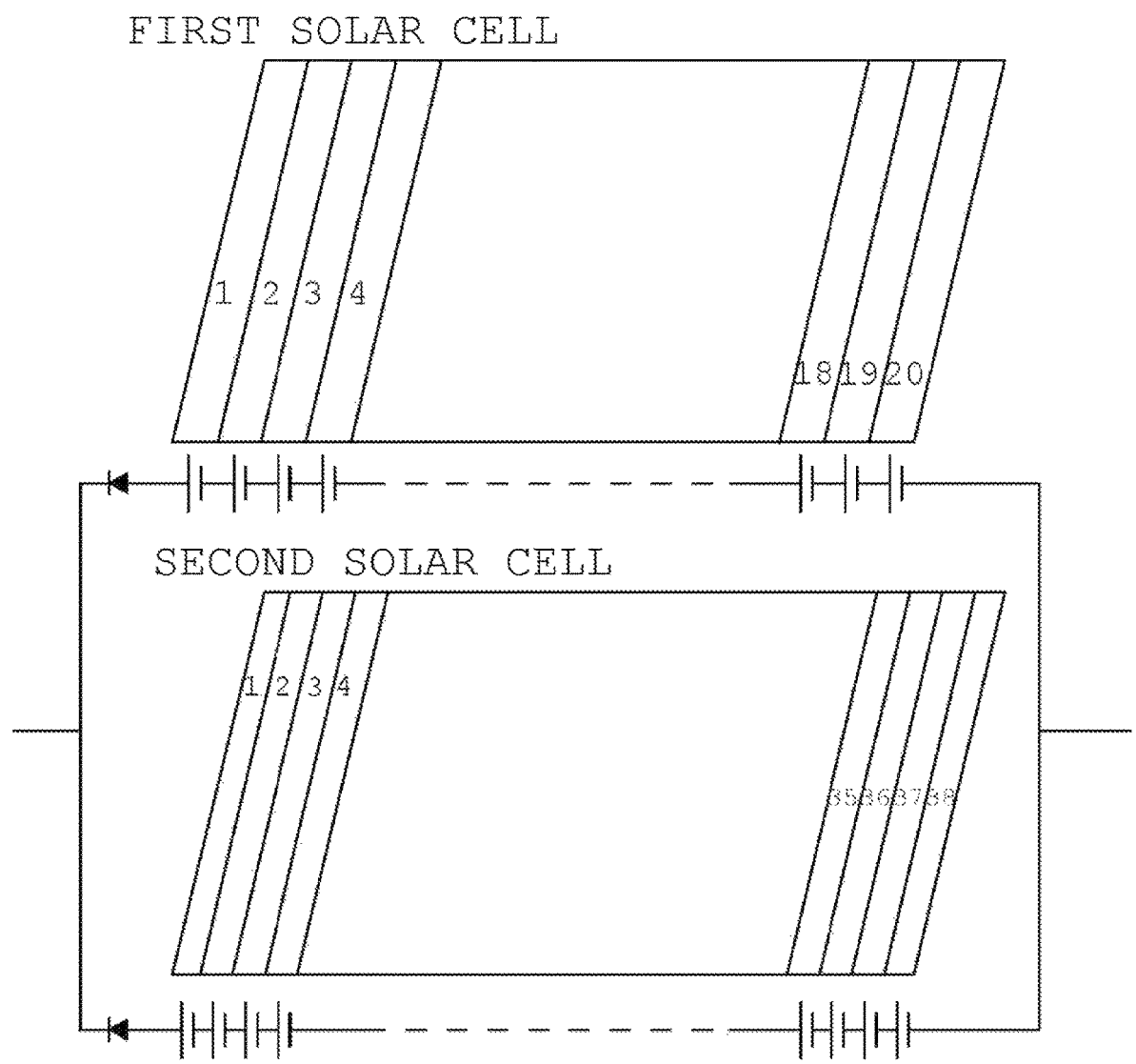
FIG. 14 is a conceptual diagram of and a circuit of a multi-junction solar cell according to an example.

Example 10 provides a multi-junction solar cell where the first solar cell and second solar cell according to Example 6 are each connected in series with a diode. FIG. 14 shows a conceptual diagram of and a circuit of the prepared multi-junction solar cell according to Example 10. On the prepared multi-junction solar cell, the open circuit voltage, short-circuit current density, and conversion efficiency are measured in the same way as in Example 1. The measured results are shown in Table 2.

EXAMPLE 11

Figure 15:
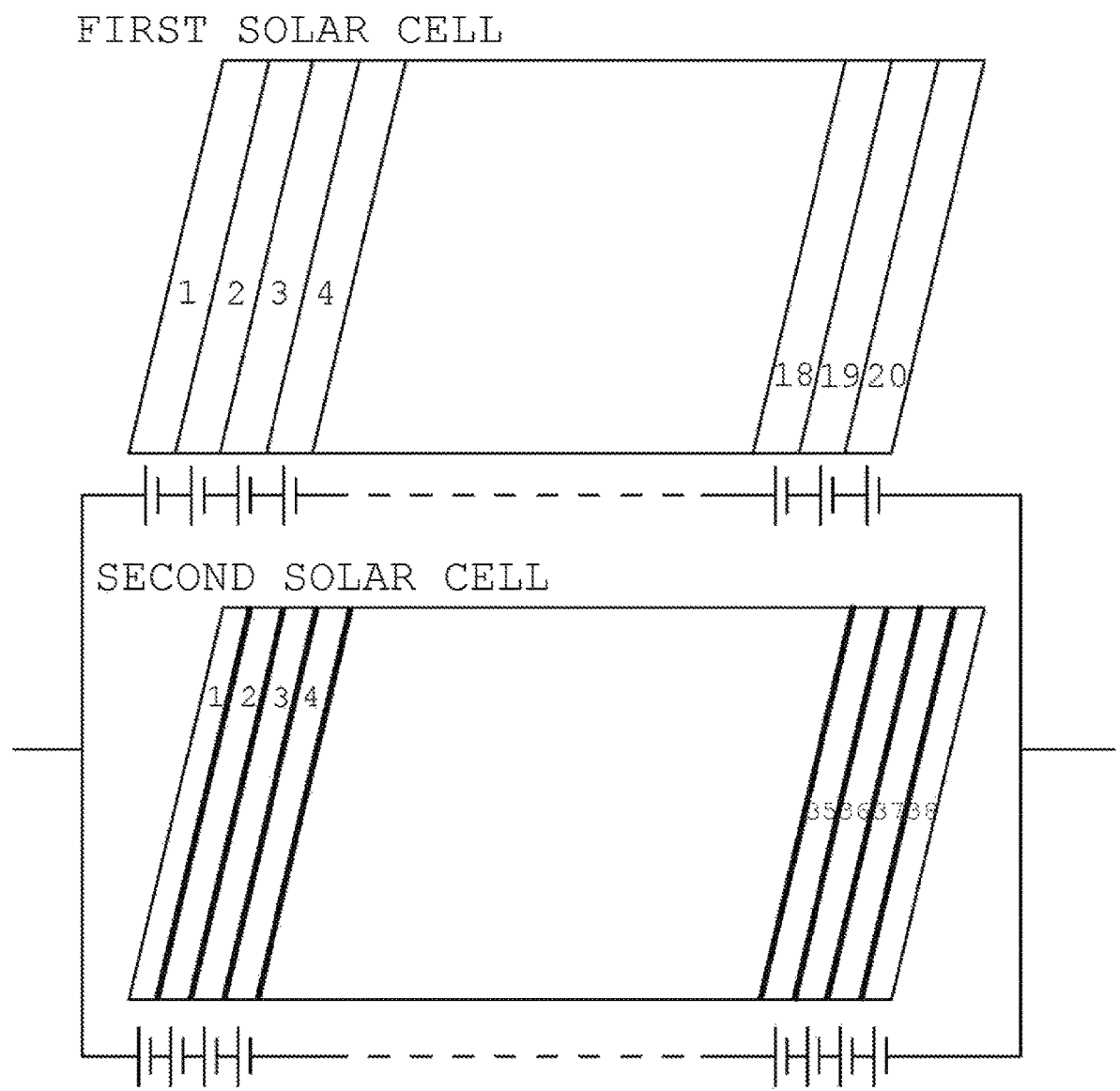
FIG. 15 is a conceptual diagram of and a circuit of a multi-junction solar cell according to an example.

In Example 11, except that an acrylic resin is poured into grooves formed through the device isolation by cutting with a dicer in the preparation of the thirty-eight second photoelectric conversion devices which are equal in area to each other in Example 6, a multi-junction solar cell is prepared in the same way as in Example 6. FIG. 15 shows a conceptual diagram of and a circuit of the prepared multi-junction solar cell according to Example 11. On the multi-junction solar cell according to Example 11, the open circuit voltage, short-circuit current density, and conversion efficiency are also measured in the same way as in Example 1. The measured results are shown in Table 2.

TABLE 2A

| | First Solar Cell | | | Second Solar Cell | | |
|---|---|---|---|---|---|---|
| | Voc (V) | Jsc (mA) | η (%) | Voc (V) | Jsc (mA) | η (%) |
| Example 6 | 24.5 | 112 | 15.2 | 24.7 | 91.5 | 12.4 |
| Example 7 | 12.3 | 224 | 15.2 | 12.3 | 187 | 12.5 |
| Example 8 | 24.5 | 112 | 15.2 | 24.7 | 82.0 | 11.0 |
| Example 9 | 24.5 | 112 | 15.2 | 24.7 | 91.5 | 12.2 |
| Example 10 | 24.2 | 111 | 14.9 | 24.4 | 90.4 | 11.9 |
| Example 11 | 24.5 | 112 | 15.2 | 24.7 | 91.5 | 12.4 |
| Comparative Example 1 | 24.5 | 112 | 15.2 | 23.9 | 91.5 | 11.9 |

TABLE 2B

| | Multi-Junction Solar Cell | | |
|---|---|---|---|
| | Voc(V) | Jsc(mA) | η(%) |
| Example 6 | 24.5 | 203 | 27.3 |
| Example 7 | 12.3 | 411 | 27.7 |
| Example 8 | 24.5 | 193 | 25.7 |
| Example 9 | 24.5 | 203 | 27.3 |
| Example 10 | 24.2 | 201 | 26.4 |
| Example 11 | 24.5 | 203 | 27.3 |
| Comparative Example 1 | 23.9 | 203 | 27.1 |

Example 6 achieves, due to the increased number of series connections and a reduced voltage difference between the first and second solar cells, a higher efficiency solar cell than Examples 1 to 5, which shows effectiveness. From Example 7, it can be understood that it is possible to reduce the number of cuts in the lower single-crystal silicon solar cell by lowering the open circuit voltage with the parallel-connected upper solar cell. This means that dead area near the cut sections can be reduced so that it is possible to improve the efficiency. The number of parallel connections can be selected freely, which thus becomes an important approach for the increase in efficiency in the creation of large panels. From Example 8, it can be understood that it is possible to prepare respective wafers and connect the wafers in series in the creation of solar cell panels. Examples 7 and 8 broaden choices for series and parallel connections, and make it easy to design high-efficiency solar cell panels. Example 9 undergoes no performance degradation, thus causing no characteristic degradation due to the placement of the bypass circuit. When some of the photoelectric conversion devices of the solar cell suffer from, for example, insulation breakdowns, the bypass for the section with the broken photoelectric conversion devices makes it possible to suppress the decrease in efficiency. Example 10 undergoes a decrease in voltage, due to the voltage effect of the diodes for backflow prevention. Although there is a decrease in efficiency as compared with the bypass diodes, the suppression of performance degradation becomes possible because internal short-circuit can be suppressed even if either the first or second solar cell is broken. Comparative Example 2 intentionally produces an operating state of the bypass diodes, and indicates only the voltage effect, thus showing the effectiveness of the bypass diodes. Example 11 indicates performance achieved when a resin is embedded in the grooves formed by cutting in the second solar cell in Example 9. No performance degradation can be confirmed. The embedded resin can increase the mechanical strength to suppress the decrease in efficiency due to partial peeling of the second solar cell.

EXAMPLE 12

In Example 12, except for the use of $Cu_{0.89}In_{0.49}Al_{0.51}Se_2$ for the p layers in the photoelectric conversion layer of the first solar cell in Example 6, a multi-junction solar cell is prepared in the same way as in Example 6. On the multi-junction solar cell according to Example 12, the open circuit voltage, short-circuit current density, and conversion efficiency are also measured in the same way as in Example 1. The measured results are shown in Table 3.

EXAMPLE 13

In Example 13, except for the use of $CuAl_{0.59}Ga_{0.41}Se_2$ for the p layers in the photoelectric conversion layer of the first solar cell in Example 6 and the change of the division number by scribing from 38 to 46, a multi-junction solar cell is prepared in the same way as in Example 6. On the multi-junction solar cell according to Example 13, the open circuit voltage, short-circuit current density, and conversion efficiency are also measured in the same way as in Example 1. The measured results are shown in Table 3.

Comparative Example 3

Except that the device isolation is not carried out, a multi-junction solar cell is prepared in the same way as in Example 12. On the multi-junction solar cell according to Comparative Example 3, the open circuit voltage, short-circuit current density, and conversion efficiency are also measured in the same way as in Example 1. The measured results are shown in Table 3.

Comparative Example 4

Except that the device isolation is not carried out, a multi-junction solar cell is prepared in the same way as in Example 13. On the multi-junction solar cell according to Comparative Example 4, the open circuit voltage, short-circuit current density, and conversion efficiency are also measured in the same way as in Example 1. The measured results are shown in Table 3.

TABLE 3A

| | First Solar Cell | | | Second Solar Cell | | |
|---|---|---|---|---|---|---|
| | Voc (V) | Jsc (mA) | η (%) | Voc (V) | Jsc (mA) | η (%) |
| Example 12 | 24.6 | 110 | 15.0 | 24.7 | 91.5 | 12.4 |
| Example 13 | 30.2 | 56.0 | 9.4 | 29.9 | 90.7 | 14.7 |
| Comparative Example 3 | 24.6 | 110 | 15.0 | 0.7 | 3440 | 12.4 |
| Comparative Example 4 | 30.2 | 56.0 | 9.4 | 0.7 | 4090 | 14.7 |

TABLE 3B

| | Multi-Junction Solar Cell | | |
|---|---|---|---|
| | Voc(V) | Jsc(mA) | η(%) |
| Example 12 | 24.6 | 201 | 26.8 |
| Example 13 | 29.9 | 146 | 23.1 |
| Comparative Example 3 | 0.7 | 3400 | 12.3 |
| Comparative Example 4 | 0.7 | 4050 | 14.5 |

Example 12 produces almost no change in the bandgap of the first solar cell, and thus shows almost no difference from Example 6. On the other hand, Example 13 produces a substantial change in the bandgap of the first solar cell, and thus undergoes a change in the amount of light absorbed by the second solar cell, while Example 13 improves the efficiency with the configuration. Comparative Examples 3 and 4 fail to achieve the effect of the multi-junction configuration of the first and second solar cells, and adversely undergo characteristic degradation. The loss is believed to be increased because of substantial differences in both voltage and current. From Comparative Examples 3 and 4, it can be understood that the multi-junction effect with the first solar cell is not achieved, unless series connections are made in the second solar cell.

From Examples 12 and 13 herein, the advantageous effect of the present disclosure can be expected even when $Cu(In, Al)Se_2$ or $Cu(Ga,Al)Se_2$ is used for the p layers of the first solar cell. From the foregoing, it can be understood that a similar effect will be achieved even in the case of $Cu(In, Al)(S,Se)_2$ or $Cu(Ga,Al)(S,Se)_2$, besides the examples previously described. Furthermore, a similar effect can be expected even in the case of $Ag(In,Ga,Al)(S,Se)_2$ with Ag in place of Cu.

In this specification, some of the elements are represented by only chemical symbols for the elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A multi-junction solar cell comprising:
   a first solar cell comprising a first photoelectric conversion device;
   a second solar cell comprising a plurality of second photoelectric conversion devices connected in series and having a back contact; and
   an insulating layer between the first solar cell and the second solar cell, wherein
   a device isolation region is provided between the second photoelectric conversion devices connected in series,
   each of the plurality of second photoelectric conversion devices has a silicon layer,
   the silicon layer of each of the plurality of the second photoelectric conversion devices has both of an n+ region and a p+ region on a side of the back contact, wherein
   the first solar cell, the insulating layer, and the second solar cell are stacked in this order,
   the first solar cell and the second solar cell are connected in parallel,
   each of the plurality of the second photoelectric conversion devices have electrodes,
   the electrodes do not exist on side surfaces of each of the plurality of the second photoelectric conversion devices,
   the side surfaces of the each of the plurality of the second photoelectric conversion devices face the device isolation region,
   light incident on a surface of the first solar cell which is opposite to the insulating layer,
   each n+ region exists from the side of the back contact to 4% or less of thickness of the silicon layer of each of the plurality of the second photoelectric conversion devices toward to the insulating layer,
   each p+ region exists from the side of the back contact to 4% or less of thickness of the silicon layer of each of the plurality of the second photoelectric conversion devices toward to the insulating layer,
   a surface of the insulating layer which is in direct contact with the first solar cell is opposite to a surface of the insulating layer which is in direct contact with the second solar cell,
   the device isolation region extends through the thickness of the second solar cell and is formed in the insulation layer, and
   the insulating layer includes soda-lime glass, quartz, glass, a resin layer, or an adhesive layer.

2. The solar cell according to claim 1, wherein the first photoelectric conversion device comprises a photoelectric conversion layer containing any of a chalcopyrite-type compound semiconductor, a stannite-type compound semiconductor, and a kesterite-type compound semiconductor.

3. The solar cell according to claim 2, wherein the silicon layer of each of the plurality of the second photoelectric conversion devices is single-crystal silicon.

4. The solar cell according to claim 1, further comprising a rectifying device connected in parallel to at least one of the first photoelectric conversion device and the second photoelectric conversion devices.

5. The solar cell according to claim 1, further comprising a rectifying device connected in series with at least one of the first solar cell and the second solar cell.

6. The solar cell according to claim 1, wherein
   the electrodes of each of the plurality of the second photoelectric conversion devices are a p-type electrode and an n-type electrode,
   each of the second photoelectric conversion devices has the p-type electrode and the n-type electrode, and
   the p-type electrode and the n-type electrode of each of the second photoelectric conversion devices are on a surface of the back contact which is opposite to the insulating layer.

7. The solar cell according to claim 6, wherein
   the p-type electrode and the n-type electrode of each of the plurality of the second photoelectric conversion devices do not extend to the device isolation region.

8. The solar cell according to claim 1, wherein the insulating layer is laminated layers which include at least two layers selected from the group consisting of the soda-lime glass, the quartz, glass, the resin layer, the adhesive layer, and a laminated body including these members.

9. The solar cell according to claim 8, wherein the second solar cell is in direct contact with one of the laminated layers of the insulating layer.

10. The solar cell according to claim 8, wherein the laminated layers of the insulating layer include an adhesive layer, the first solar cell is not in direct contact with the adhesive layer of the laminated layers, and the second solar cell is in direct contact with the adhesive layer of the laminated layers.

11. The solar cell according to claim 1, wherein the device isolation region is filled with an insulator.

12. The solar cell according to claim 1, wherein the insulating layer includes laminated insulating layers.

13. The solar cell according to claim 1,
wherein the first solar cell comprises a plurality of first photoelectric conversion devices,
the solar cell further comprises electrodes of each of the plurality of the first photoelectric conversion devices,
the electrodes of each of the plurality of the first photoelectric conversion devices entirely exist on a side of the plurality of the first photoelectric conversion devices.

14. The solar cell according to claim 1,
wherein the first solar cell comprises a plurality of first photoelectric conversion devices,
the solar cell further comprises electrodes of each of the plurality of the first photoelectric conversion devices, and
electrodes of each of the plurality of the second photoelectric conversion devices,
the electrodes of each of the plurality of the first photoelectric conversion devices entirely exist on a side of the plurality of the first photoelectric conversion devices, and
the electrodes of each of the plurality of the second photoelectric conversion devices entirely exist on a side of the plurality of the second photoelectric conversion devices.

15. The solar cell according to claim 1,
wherein the first solar cell comprises a plurality of first photoelectric conversion devices,
the solar cell further comprises electrodes of each of the plurality of the first photoelectric conversion devices, wherein
none of the electrodes of each of the plurality of the first photoelectric conversion devices exist on a side of the plurality of the second photoelectric conversion devices.

16. The solar cell according to claim 1, wherein the n+ region and the p+ region do not exist at the side surfaces of each of the plurality of the second photoelectric conversion devices.

17. The solar cell according to claim 1, wherein
a depth of the n+ region is 50 nm to 2 μm, and
a depth of the p+ region is 50 nm to 2 μm.

* * * * *